United States Patent
Inagaki et al.

(10) Patent No.: US 11,894,804 B2
(45) Date of Patent: Feb. 6, 2024

(54) PHOTOVOLTAIC MODULE, PHOTOVOLTAIC PANEL, AND PRODUCTION METHOD FOR PHOTOVOLTAIC MODULE

(71) Applicant: Sumitomo Electric Industries, Ltd., Osaka (JP)

(72) Inventors: Makoto Inagaki, Osaka (JP); Youichi Nagai, Osaka (JP); Kenji Saito, Osaka (JP); Takashi Iwasaki, Osaka (JP); Rui Mikami, Osaka (JP); Tomohiro Nemoto, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 258 days.

(21) Appl. No.: 17/141,917

(22) Filed: Jan. 5, 2021

(65) Prior Publication Data
US 2021/0126579 A1    Apr. 29, 2021

Related U.S. Application Data

(63) Continuation-in-part of application No. 15/320,709, filed as application No. PCT/JP2015/067817 on Jun. 22, 2015, now abandoned.

(30) Foreign Application Priority Data

Jun. 27, 2014 (JP) ................... 2014-132501
Sep. 8, 2014 (JP) ................... 2014-182362

(51) Int. Cl.
*H02S 20/10* (2014.01)
*H02S 30/10* (2014.01)
(Continued)

(52) U.S. Cl.
CPC ............ *H02S 40/22* (2014.12); *H01L 31/048* (2013.01); *H01L 31/0543* (2014.12); *H02S 20/10* (2014.12); *H02S 30/10* (2014.12)

(58) Field of Classification Search
CPC .......... C08J 5/04–24; C08J 5/10; C08J 5/043; H02S 40/22; H02S 20/10; H02S 30/10; H01L 31/048; H01L 31/0543
See application file for complete search history.

(56) References Cited

U.S. PATENT DOCUMENTS 5,497,587 A    3/1996  Hirai et al.
6,057,505 A    5/2000  Ortabasi
(Continued)

FOREIGN PATENT DOCUMENTS

CN    1558410 A     12/2004
JP    H06-158798 A   6/1994
(Continued)

OTHER PUBLICATIONS

English machine translation WO 2003092984 (Year: 2003).*
(Continued)

*Primary Examiner* — Kourtney R S Carlson
(74) *Attorney, Agent, or Firm* — McCarter & English, LLP; Michael A. Sartori

(57) ABSTRACT

This photovoltaic module includes: a power generating element configured to receive sunlight to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion. The side wall is a resin molded body including a resin and glass fibers dispersed in the resin, the resin is one of PET (Polyethylene terephthalate), PBT (Poly-
(Continued)

butylene Terephthalate), and PP (Polypropylene), and the glass fibers are orientated, in the resin, along a crossing direction that crosses a direction of an optical axis of the lens.

3 Claims, 18 Drawing Sheets

(51) Int. Cl.
*H02S 40/22* (2014.01)
*H01L 31/054* (2014.01)
*H01L 31/048* (2014.01)

(56) References Cited

U.S. PATENT DOCUMENTS

| | | | |
|---|---|---|---|
| 6,399,874 | B1 | 6/2002 | Olah |
| 6,559,371 | B2 | 5/2003 | Shingleton et al. |
| 8,592,738 | B1 | 11/2013 | Kozin et al. |
| 2002/0148497 | A1 | 10/2002 | Sasaoka et al. |
| 2006/0266408 | A1 | 11/2006 | Horne et al. |
| 2007/0295384 | A1 | 12/2007 | Uozumi et al. |
| 2009/0126794 | A1 | 5/2009 | Dimroth et al. |
| 2009/0133737 | A1 | 5/2009 | Anzawa et al. |
| 2009/0260674 | A1 | 10/2009 | Linke |
| 2010/0018570 | A1 | 1/2010 | Cashion et al. |
| 2010/0025869 | A1* | 2/2010 | Suzuishi ............ B29C 45/0025 425/543 |
| 2011/0030767 | A1 | 2/2011 | Ehbing et al. |
| 2012/0240978 | A1* | 9/2012 | Celaya Prieto ....... H01L 31/052 136/246 |
| 2012/0325289 | A1 | 12/2012 | Deck |
| 2013/0136877 | A1* | 5/2013 | Nelson .................. B29C 48/15 428/34.5 |
| 2015/0059851 | A1 | 3/2015 | Gerster et al. |
| 2015/0136201 | A1 | 5/2015 | Mariotto et al. |
| 2017/0133980 | A1 | 5/2017 | Inagaki et al. |

FOREIGN PATENT DOCUMENTS

| | | | |
|---|---|---|---|
| JP | 07-274742 | A | 10/1995 |
| JP | H10-152957 | A | 6/1998 |
| JP | H10-231600 | A | 9/1998 |
| JP | 2002-289900 | A | 10/2002 |
| JP | 2006-344698 | A | 12/2006 |
| JP | 2008-004661 | A | 1/2008 |
| JP | 2008-084955 | A | 4/2008 |
| JP | 4953745 | B2 | 6/2012 |
| JP | 2013-207079 | A | 10/2013 |
| JP | 2014-099492 | A | 5/2014 |
| WO | WO-03092984 A1 * | | 11/2003 ............ B29C 45/00 |
| WO | WO-2004035295 A1 * | | 4/2004 ............ B29B 7/603 |
| WO | 2013/150031 | A1 | 10/2013 |
| WO | 2014009288 | A1 | 1/2014 |

OTHER PUBLICATIONS

Blumentritt, Bruce F., "Anisotropy and Dimensional Stability of Biaxially Oriented Poly(Ethylene Terephthalate) Films," Journal of Applied Polymer Science, vol. 23, No. 11, 1979, pp. 3205-3217. [Cited in Parent].
Advisory Action issued in U.S. Appl. No. 15/321,098 dated Apr. 23, 2020. [Cited in Parent].
Office Action issued in U.S. Appl. No. 15/321,098 dated Jan. 10, 2020. [Cited in Parent].
Office Action issued in U.S. Appl. No. 15/321,098 dated Jun. 15, 2018. [Cited in Parent].
Office Action issued in U.S. Appl. No. 15/321,098 dated Feb. 5, 2019. [Cited in Parent].
Office Action issued in U.S. Appl. No. 15/321,098 dated Jul. 15, 2019. [Cited in Parent].
International Search Report in International Application No. PCT/JP2015/067817, dated Aug. 18, 2015. [Cited in Parent].

* cited by examiner

PHOTOVOLTAIC MODULE, PHOTOVOLTAIC PANEL, AND PRODUCTION METHOD FOR PHOTOVOLTAIC MODULE

TECHNICAL FIELD

The present invention relates to a photovoltaic module, and in particular, relates to a photovoltaic module in which power generating elements provided in the housing thereof receive sunlight to generate power corresponding to the amount of the received light.

BACKGROUND ART

To date, photovoltaic modules which concentrate sunlight and convert the sunlight into power have been developed. For example, PATENT LITERATURE 1 (International Publication WO 2013/150031) discloses the following technology. That is, the concentrator photovoltaic apparatus described in PATENT LITERATURE 1 includes a lens and a power generating element in a housing, wherein a gas is caused to flow into the housing whereby the distance between the lens and the power generating element is adjusted.

Meanwhile, for example, PATENT LITERATURE 2 (U.S. Pat. No. 8,592,738) discloses the following technology.

That is, in the concentrator solar generator described in PATENT LITERATURE 2, a device for confirming the optical axis of incident light is mounted.

Next, for example, PATENT LITERATURE 3 (Japanese Patent No. 4953745) discloses the following technology. That is, the concentrator photovoltaic unit described in PATENT LITERATURE 3 includes: a translucent protecting plate on which condenser lenses for concentrating sunlight are joined and which protects the upper face of the concentrator photovoltaic unit; a long-sized frame forming the basic structure of the concentrator photovoltaic unit; and a solar battery mounting plate on which a plurality of solar batteries are mounted. The long-sized frame is provided with vent holes at end portions in the longitudinal direction, thereby generating an airflow inside the long-sized frame.

Furthermore, for example, PATENT LITERATURE 4 (Japanese Laid-Open Patent Publication No. 2008-4661) discloses the following technology. That is, the concentrator solar generator described in PATENT LITERATURE 4 includes a case surrounded by a bottom member, a surrounding member, and a top member, the case having a space formed therein, the case configured to be inclined when used such that the top member faces the sun. The top member of this case is provided with a plurality of Fresnel lenses for concentrating sunlight. Inside the case, a plurality of solar battery cells are provided which respectively receive light concentrated by the respective Fresnel lenses to generate power. At least two opening portions are provided in each of opposed surfaces of the surrounding member of the case. In addition, one of the two opening portions in each of the opposed surfaces is disposed at an upper portion close to the Fresnel lenses and the other is disposed at a lower portion close to the solar battery cells.

CITATION LIST

Patent Literature

PATENT LITERATURE 1: International Publication WO 2013/150031
PATENT LITERATURE 2: U.S. Pat. No. 8,592,738
PATENT LITERATURE 3: Japanese Patent No. 4953745
PATENT LITERATURE 4: Japanese Laid-Open Patent Publication No. 2008-4661
PATENT LITERATURE 5: Japanese Laid-Open Patent Publication No. H7-274742

SUMMARY OF INVENTION

Technical Problem

The underlying common and ultimate challenge for the conventional technologies mentioned above is to apply concentrated sunlight to each power generating element always at an accurate position on the optical axis in severe outdoor environment. However, it is difficult to always realize such accurate application of light in severe environment, and as a result, sufficient power generation efficiency has not been attained.

In view of the above problem, an object of the present invention is to realize a configuration that can further enhance the power generation efficiency of a photovoltaic module.

Solution to Problem

A photovoltaic module of the present invention includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein the lens includes: a glass substrate; and a silicone resin or an acrylic resin provided on the glass substrate, and the side wall is formed by use of PET (polyethylene terephthalate) or PBT (polybutylene terephthalate).

A photovoltaic module of the present invention includes: a power generating element configured to receive light to generate power; a housing which is closed, the housing having: a concentrating portion provided with a lens configured to concentrate sunlight; a bottom portion in which the power generating element is disposed; and a side wall serving as an outer frame for the bottom portion and supporting the concentrating portion; and an optical-axis confirmation portion formed integrally with the side wall by use of a resin, the optical-axis confirmation portion for confirming an optical axis of incident light incident on the photovoltaic module, wherein the lens includes: a glass substrate; and a silicone resin or an acrylic resin provided on the glass substrate, and the side wall is formed by use of PET (polyethylene terephthalate) or PBT (polybutylene terephthalate).

Meanwhile, a photovoltaic panel of the present invention includes: a panel housing having a dish-like shape partitioned into a plurality of sections by a frame member; and a plurality of photovoltaic modules mounted to the sections, wherein the photovoltaic module includes: a power generating element configured to receive light to generate power; and a housing which is closed, the housing having: a concentrating portion provided with a lens configured to concentrate sunlight; a bottom portion in which the power generating element is disposed; and a side wall serving as an outer frame of the bottom portion and supporting the concentrating portion, the lens includes: a glass substrate; and a silicone resin or an acrylic resin provided on the glass substrate, and the side wall is formed by use of PET (polyethylene terephthalate) or PBT (polybutylene terephthalate).

Advantageous Effects of Invention

According to the present invention, it is possible to realize a configuration that can further enhance the power generation efficiency of a photovoltaic module.

DESCRIPTION OF EMBODIMENTS

Summary of Embodiment

Figure 1:
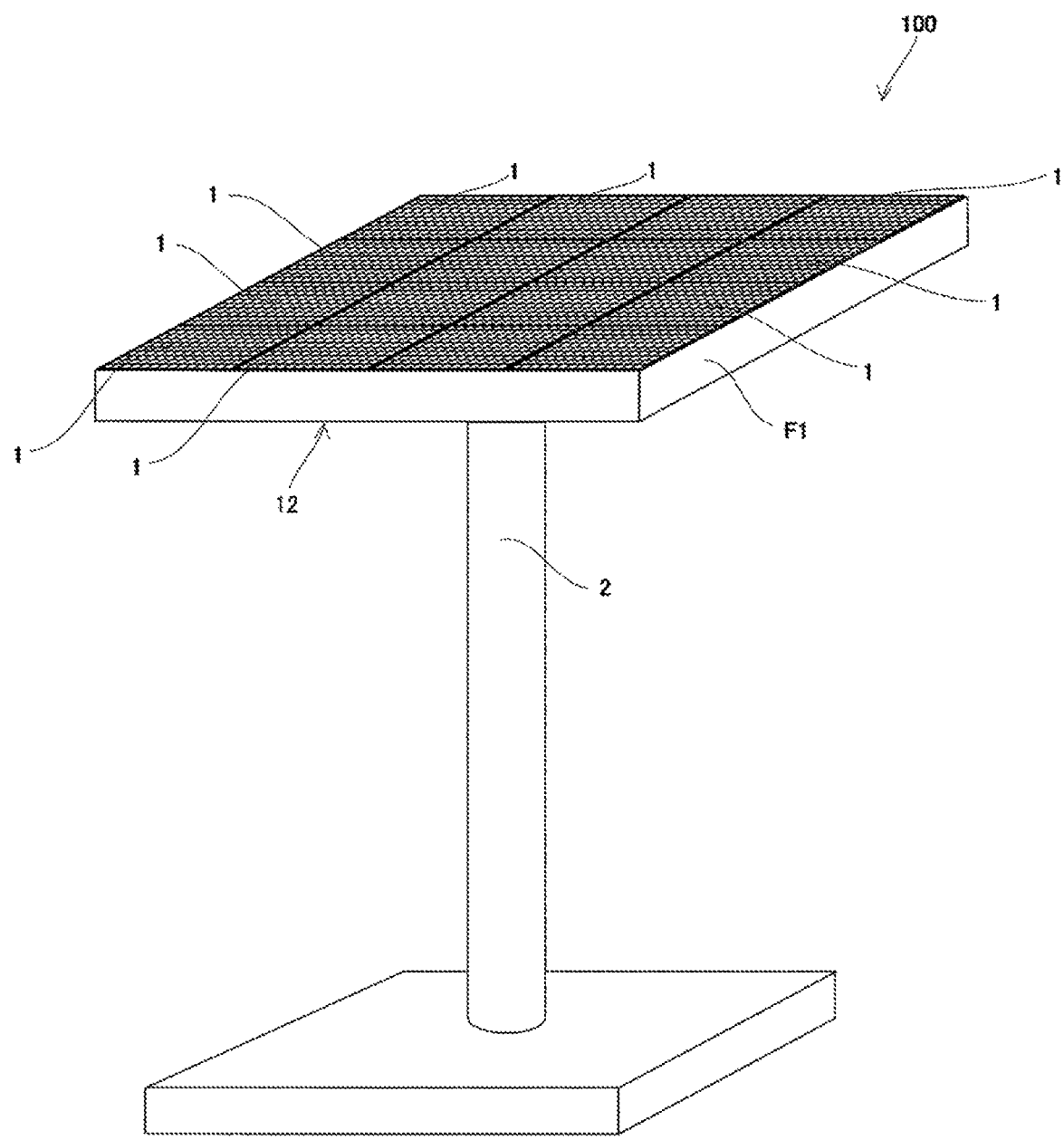
FIG. 1 is a perspective view showing the appearance of a photovoltaic apparatus according to a first embodiment.

The summary of embodiment of the present invention includes at least the following.

(1) A photovoltaic module according to an embodiment of the present invention includes: a power generating element configured to receive light to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein the lens includes: a glass substrate; and a silicone resin or an acrylic resin provided on the glass substrate, and the side wall is formed by use of PET (polyethylene terephthalate) or PBT (polybutylene terephthalate).

With this configuration, the amount of change in the focal length of the lens in association with change in air temperature can be made close to the amount of change in the distance between the lens and the power generating element due to expansion or contraction of the side wall in association with the change in the air temperature. Thus, decrease in the power generation efficiency of the photovoltaic module can be effectively suppressed. In addition, strength necessary for the side wall can be ensured.

(2) In the photovoltaic module according to (1), for example, the side wall is formed by use of a material having anisotropy in coefficient of thermal expansion, the side wall being formed such that a direction in which the coefficient of thermal expansion is larger extends along a direction of an optical axis of the lens.

With this configuration, the amount of the change in the distance between the lens and the power generating element in association with the change in the air temperature is further increased. Thus, it is possible to enhance the possibility that the amount of the change in the distance between the lens and the power generating element will follow the amount of the change in the focal length of the lens in association with the change in the air temperature.

(3) A photovoltaic module according to the embodiment of the present invention from another aspect includes: a power generating element configured to receive light to generate power; a housing which is closed, the housing having: a concentrating portion provided with a lens configured to concentrate sunlight; a bottom portion in which the power generating element is disposed; and a side wall serving as an outer frame for the bottom portion and supporting the concentrating portion; and an optical-axis confirmation portion formed from a resin integrally with the side wall, the optical-axis confirmation portion for confirming an optical axis of incident light incident on the photovoltaic module, wherein the lens includes: a glass substrate; and a silicone resin or an acrylic resin provided on the glass substrate, and the side wall is formed by use of PET (polyethylene terephthalate) or PBT (polybutylene terephthalate).

With this configuration, the amount of change in the focal length of the lens in association with change in the air temperature can be made close to the amount of change in the distance between the lens and the power generating element due to expansion or contraction of the side wall in association with the change in the air temperature. Thus, decrease in the power generation efficiency of the photovoltaic module can be effectively suppressed. In addition, strength necessary for the side wall can be ensured.

In addition, since it is not necessary to additionally use a new member for confirming the optical axis of the incident light, low cost can be realized. Further, high assembling accuracy for ensuring the optical axis accuracy is not required. Therefore, a further excellent photovoltaic module can be provided.

(4) In the photovoltaic module according to (3), for example, the optical-axis confirmation portion includes: an upper face; and a bottom face, an intake hole is formed in the upper face, the intake hole being for guiding the incident light to an interior space of the optical-axis confirmation portion, and a plurality of visual confirmation holes are formed in the bottom face, the visual confirmation holes being for confirming the optical axis of the incident light having been guided to the interior space.

With this configuration, if the visual confirmation hole through which light is passing is identified from among the plurality of the visual confirmation holes, it is possible to easily confirm the optical axis of the incident light. In addition, the side wall and the optical-axis confirmation portion can be formed from the same material. Thus, for example, by performing injection molding, it is possible to manufacture the side wall and the optical-axis confirmation portion relatively easily and at low cost.

(5) In the photovoltaic module according to (3), for example, the optical-axis confirmation portion includes: an upper face; a bottom face; and an intermediate face provided between the upper face and the bottom face, an intake hole is formed in the upper face, the intake hole being for guiding the incident light to an interior space of the optical-axis confirmation portion, and a passage hole is formed in the intermediate face, the passage hole for allowing light having been incident on the upper face at a predetermined angle to pass therethrough to reach the bottom face.

With this configuration, by confirming whether light has reached the bottom face of the optical-axis confirmation portion, it is possible to easily confirm whether the incident light is incident at a predetermined angle on the upper face of the photovoltaic module. In addition, the side wall and the optical-axis confirmation portion can be formed from the same material. Therefore, for example, by performing injection molding, it is possible to manufacture the side wall and the optical-axis confirmation portion relatively easily and at low cost.

(6) In the photovoltaic module according to (3), for example, the optical-axis confirmation portion includes: an upper face; and a bottom face, an intake hole is formed in the upper face, the intake hole being for guiding the incident light to an interior space of the optical-axis confirmation portion, and the bottom face is formed by use of a light-transmitting material.

With this configuration, by viewing the optical-axis confirmation portion from the bottom face side, for example, it is possible to confirm which position on the bottom face the light has reached. Thus, it is possible to easily confirm the optical axis of the incident light. Since work and the like for forming many holes is not required, the photovoltaic module including the optical-axis confirmation portion can be manufactured at low cost.

(7) In the photovoltaic module according to any one of (3) to (6), for example, the housing is fixed to a frame member, and the optical-axis confirmation portion is provided to, among faces of the side wall, a face other than faces that are opposed to the frame member in a state where the housing corresponding to the optical-axis confirmation portion is fixed to the frame member.

With this configuration, it is not necessary to take into consideration of the presence of the optical-axis confirmation portion when fixing the housing to the frame member. With this relatively low-cost and simple configuration, a photovoltaic module including an optical-axis confirmation portion can be realized.

(8) A photovoltaic panel an embodiment of the present invention includes: a panel housing having a dish-like shape partitioned into a plurality of sections by a frame member; and a plurality of photovoltaic modules mounted to the sections, wherein the photovoltaic module includes: a power generating element configured to receive light to generate power; and a housing which is closed, the housing having: a concentrating portion provided with a lens configured to concentrate sunlight; a bottom portion in which the power generating element is disposed; and a side wall serving as an outer frame of the bottom portion and supporting the concentrating portion, the lens includes: a glass substrate; and a silicone resin or an acrylic resin provided on the glass substrate, and the side wall is formed by use of PET (polyethylene terephthalate) or PBT (polybutylene terephthalate).

With this configuration, the amount of change in the focal length of the lens in association with change in air temperature can be made close to the amount of change in the distance between the lens and the power generating element due to expansion or contraction of the side wall in association with the change in the air temperature. Thus, decrease in the power generation efficiency of the photovoltaic module can be effectively suppressed. In addition, strength necessary for the side wall can be ensured.

Even though the photovoltaic module has the side wall made from a resin, the photovoltaic module exhibits sufficient mechanical strength by being mounted to the panel housing.

A photovoltaic module according to the embodiment includes: a power generating element configured to receive sunlight to generate power; and a housing which is closed, the housing having: a concentrating portion provided with a lens configured to concentrate sunlight; a bottom portion in which the power generating element is disposed; and a side wall serving as an outer frame for the bottom portion and supporting the concentrating portion. The side wall is a resin molded body including a resin and glass fibers dispersed in the resin, the resin is one of PET (Polyethylene terephthalate), PBT (Polybutylene Terephthalate), and PP (Polypropylene), and the glass fibers are orientated, in the resin, along a crossing direction that crosses a direction of an optical axis of the lens.

According to the photovoltaic module having the above configuration, the glass fibers are orientated along the crossing direction in the resin. Therefore, the coefficient of thermal expansion of the side wall in the crossing direction is dependent on the coefficient of thermal expansion of the glass fiber. In addition, the coefficient of thermal expansion of the side wall in the direction of the optical axis of the lens is dependent on the coefficient of thermal expansion of the resin.

The coefficient of thermal expansion of the resin is greater than the coefficient of thermal expansion of the glass fiber. Thus, the coefficient of thermal expansion of the side wall in the direction of the optical axis of the lens is greater than the coefficient of thermal expansion of the side wall in the crossing direction.

Accordingly, even when the focal length of the lens is increased due to rise of the air temperature, the distance between the lens and the power generating element is also increased because the side wall appropriately expands. As a result, a large decrease in the light amount of sunlight concentrated to the power generating element can be prevented, and decrease in the power generation efficiency of the photovoltaic apparatus can be suppressed.

Thus, according to the present embodiment, decrease in the power generation efficiency of the photovoltaic apparatus due to change in the air temperature can be suppressed.

Meanwhile, since the coefficient of thermal expansion of the side wall in the crossing direction is relatively small, change in the shape of the side wall in the crossing direction due to change in the air temperature can be suppressed. As a result, the side wall can appropriately support the concentrating portion irrespective of change in the air temperature.

In the above photovoltaic module,
the side wall may have a rectangular frame shape including four wall portions, and
the four wall portions may each include a gate mark being a trace of a gate used at injection molding.

In this case, the gate of a metal mold for injection-molding the side wall is provided to each of portions corresponding to the four wall portions in the metal mold.

Therefore, the injection state of the molten resin containing the glass fibers can be individually adjusted at each of the gates corresponding to the four wall portions. As a result, variation, in the orientation direction of the glass fibers, that occurs between the four wall portions can be suppressed.

In the above photovoltaic module,
the gate mark may be provided at each of both end portions in the crossing direction of an outer face of each of the four wall portions.

In this case, the gate is provided at each of portions, in the metal mold, that correspond to both end portions in the crossing direction of the outer face of each wall portion. That is, the resin for forming the wall portion is injected from two gates separated in the crossing direction. Therefore, variation, in the orientation direction of the glass fibers, that occurs in each wall portion can be suppressed.

Further, each gate is provided in a vicinity of a corner portion that is continuous to a pair of wall portions adjacent to each other among the four wall portions. Thus, distortion and unevenness in strength of the side wall can be suppressed.

In addition, each gate mark functions as a rib in the vicinity of the corner portion continuous to a pair of wall portions adjacent to each other among the four wall portions, thereby being able to increase the strength of the housing.

In the above photovoltaic module,
a content proportion of the glass fibers in the resin molded body can be not less than 5 weight % and not higher than 40 weight %.

When the content proportion is less than 5 weight %, strength of the side wall could be decreased more than necessary. When the content proportion exceeds 40 weight %, the molten resin containing the glass fibers is less likely to smoothly flow in the metal mold for molding, and thus, a hollow or a warp could be caused in the side wall.

When the content proportion is set to be not less than 5 weight % and not higher than 40 weight %, an appropriate side wall can be obtained.

In the photovoltaic module,
a length of each glass fiber can be not less than 0.1 mm and not greater than 3 mm, and a diameter of the glass fiber can be not less than 1 μm and not greater than 50 μm.

When the length of the glass fiber is smaller than 0.1 mm, sufficient contribution to the coefficient of thermal expansion of the side wall cannot be obtained. When the length of the glass fiber is greater than 3 mm, the molten resin containing the glass fibers is less likely to smoothly flow in the metal mold for molding, and a hollow or a warp could be caused in the side wall.

When the diameter of the glass fiber is smaller than 1 μm, sufficient contribution to the coefficient of thermal expansion of the side wall cannot be obtained. When the diameter of the glass fiber is greater than 50 μm, the molten resin containing the glass fibers is less likely to smoothly flow in the metal mold for molding, and a hollow or a warp could be caused in the side wall.

When the length of the glass fiber is set to be not less than 0.1 mm and not greater than 3 mm, and the diameter of the glass fiber is set to be not less than 1 μm and not greater than 50 μm, an appropriate side wall can be obtained.

A production method for the photovoltaic module in which
the side wall has a rectangular frame shape including four wall portions, and
a plurality of gates are provided, in a metal mold for injection-molding the side wall, at each of portions that correspond to the four wall portions,
includes:
a step of injecting the resin containing the glass fibers and in a molten state, from the plurality of gates into the metal mold, and of curing the resin; and
a step of taking out, from the metal mold, the side wall being the resin molded body obtained by curing the resin.

According to the production method having the above configuration, the resin containing the glass fibers and in a molten state is injected to portions, in the metal mold for molding the side wall, that correspond to the four wall portions, thereby forming the side wall. Accordingly, the injection state of the molten resin can be individually adjusted at each of the gates corresponding to the four wall portions. Accordingly, variation, in the orientation direction of the glass fibers, that occurs between the four wall portions can be suppressed. Further, it becomes easy to inject the glass fibers contained in the molten resin while orientating the glass fibers in a predetermined direction.

In the production method for the photovoltaic module,
the portions, in the metal mold, that correspond to the four wall portion may be portions that correspond to both end portions in the crossing direction of each of the four wall portions.

In this case, the resin for forming the wall portion is injected from two gates separated in the crossing direction. Therefore, variation, in the orientation direction of the glass fibers, that occurs in each wall portion, can be suppressed.

Further, each gate is provided in a vicinity of a corner portion that is continuous to a pair of wall portions adjacent to each other among the four wall portions. Thus, distortion and unevenness in strength of the side wall can be suppressed.

Details of Embodiments

Hereinafter, embodiments of the present invention will be described with reference to the drawings.

It should be noted that the same or corresponding components are denoted by the same reference signs. In addition, at least some parts of embodiments described below can be combined as desired.

First Embodiment

[Configuration of Photovoltaic Apparatus]

Figure 2:
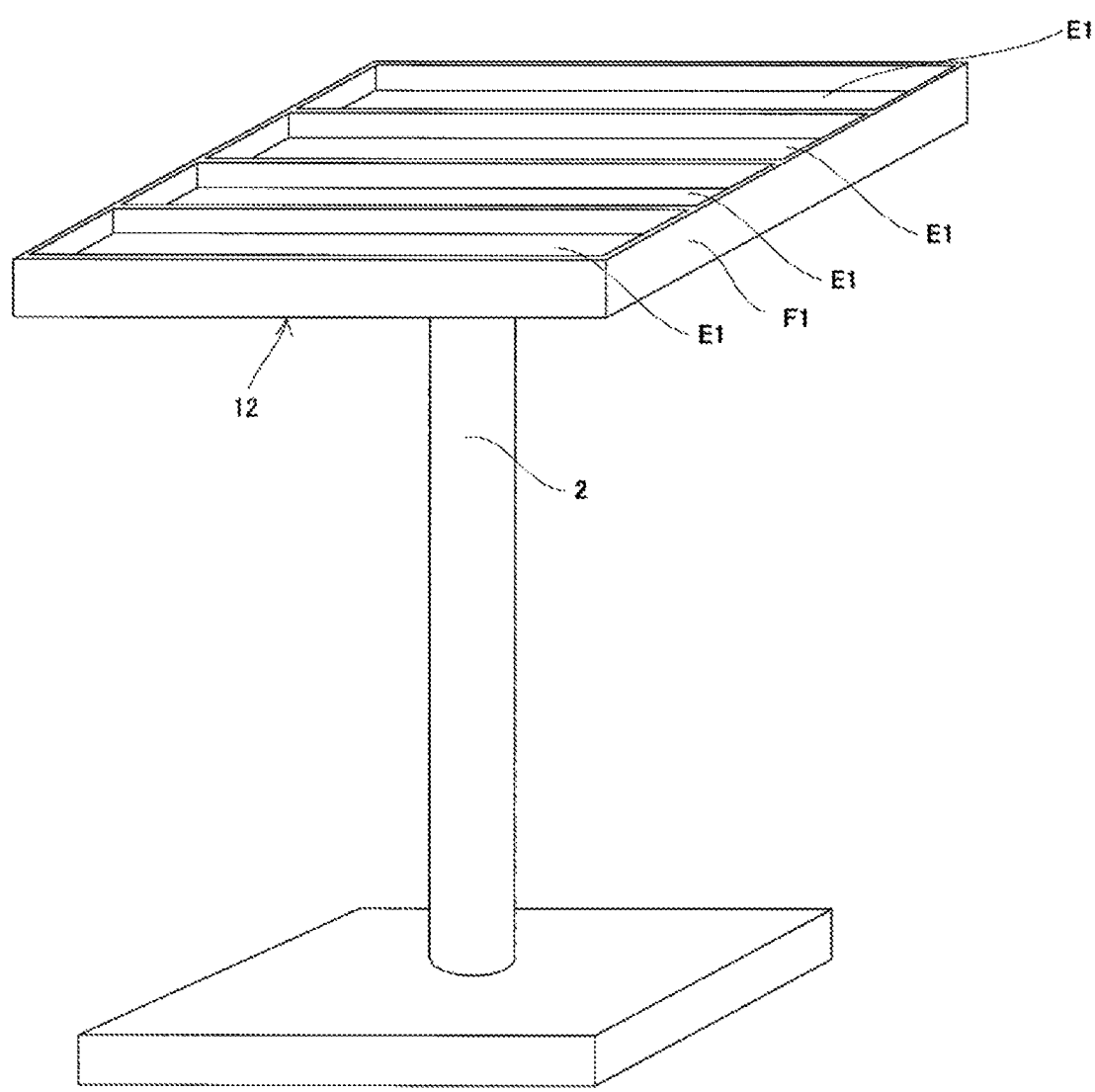
FIG. 2 is a perspective view showing a configuration of a pedestal shown in FIG. 1.

FIG. 1 is a perspective view showing the appearance of a photovoltaic apparatus according to a first embodiment. FIG. 2 is a perspective view showing a configuration of a pedestal shown in FIG. 1.

With reference to FIG. 1, a photovoltaic apparatus 100 includes a plurality of the photovoltaic modules 1 and a pedestal 2. The pedestal 2 includes a frame member F1, a sun azimuth meter C1 not shown, and a drive portion M1 not shown. The sun azimuth meter C1 includes a sensor for detecting the position of the sun. The plurality of the photovoltaic modules 1 are arrayed and fixed to the frame member F1.

The drive portion M1 recognizes the position of the sun on the basis of a signal outputted from the sun azimuth meter C1, and changes the orientation of the frame member F1 such that the light receiving faces of the photovoltaic modules 1 face the sun from the sunrise till sunset, for example.

With reference to FIG. 2, the frame member F1 of the pedestal 2 is configured such that a plurality of bars are arranged in parallel or in substantially parallel to each other, for example. One or a plurality of photovoltaic modules 1 are inserted in each of rectangular parallelepiped (without upper face and with bottom face) housing portions E1 formed by the frame member F1. Each housing portion E1 shown in FIG. 2 is a rectangular parallelepiped, but the housing portion E1 may be a cube or the like.

A panel housing (entire frame) 12 having the plurality of housing portions E1 is in a dish-like shape partitioned into a plurality of sections (housing portions) by the frame member F1. Although the side wall of the photovoltaic module described later is made from a resin, even such a photovoltaic module exhibits sufficient mechanical strength by being mounted to the panel housing 12.

[Configuration of Photovoltaic Module]

Figure 3:
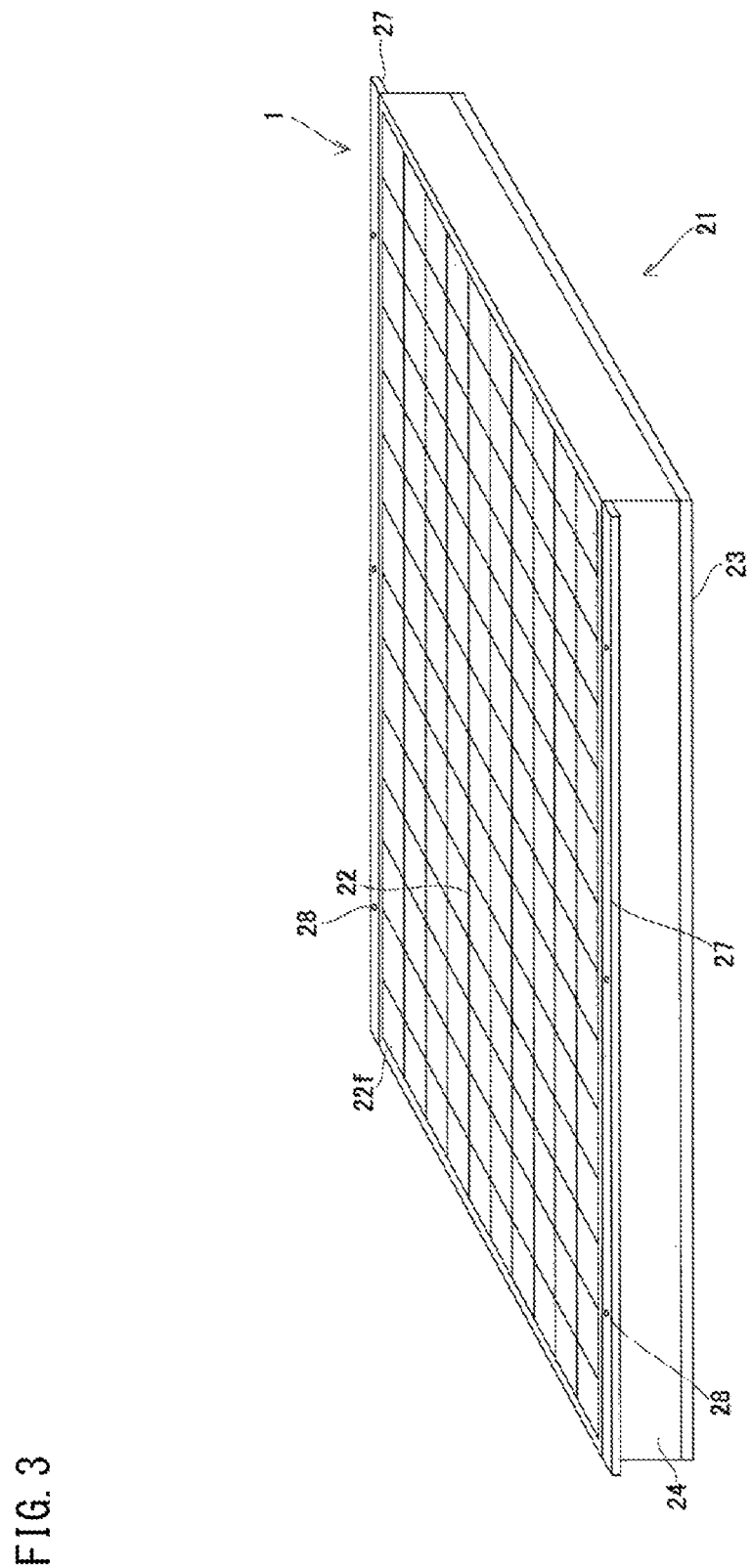
FIG. 3 is a perspective view showing the appearance of a photovoltaic module according to the first embodiment.
Figure 4:
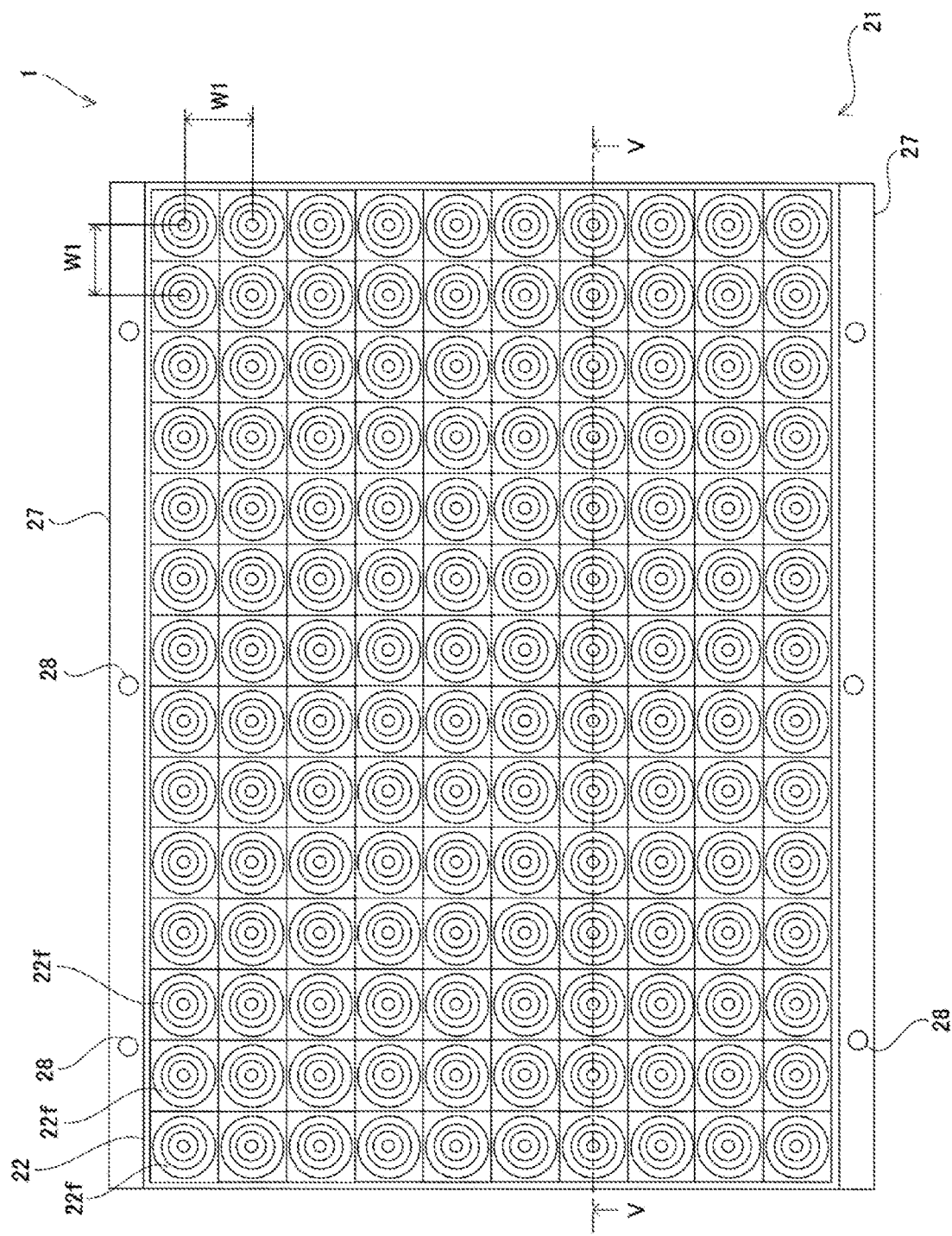
FIG. 4 is a plan view of the photovoltaic module according to the first embodiment.

FIG. 3 is a perspective view showing the appearance of the photovoltaic module according to the first embodiment. FIG. 4 is a plan view of the photovoltaic module according to the first embodiment.

With reference to FIG. 3 and FIG. 4, the photovoltaic module 1 includes a housing 21 having a rectangular parallelepiped or cubic shape. The housing 21 includes: a concentrating portion 22 which corresponds the upper face of the housing 21; a bottom portion 23 which corresponds the bottom face of the housing 21; a side wall 24; and flanges 27. The concentrating portion 22 is formed by use of glass, for example, and includes a plurality of Fresnel lenses (lens) 22f.

In the concentrating portion 22, the Fresnel lenses 22f are arranged in a square lattice pattern, for example. Specifically, the Fresnel lenses 22f are disposed such that the distances between the centers of the Fresnel lenses 22f adjacent to each other are each W1, for example. In addition, each Fresnel lens 22f includes: a glass substrate; and a silicone resin or an acrylic resin deposited on the glass substrate, for example.

The bottom portion 23 is formed by use of aluminium having a thickness of 1 mm, for example. The side wall 24 connects the concentrating portion 22 and the bottom portion 23. More specifically, the concentrating portion 22 closes the upper end of the side wall 24, and the lower end of the side wall 24 is received by the bottom portion 23.

The side wall 24 is formed by use of a resin such as PET (polyethylene terephthalate) or PBT (polybutylene terephthalate). It is preferable that the side wall 24 is formed from a resin having a large coefficient of thermal expansion. For example, when PET and PBT are compared with each other, it is preferable that the side wall 24 is formed by use of PBT.

In addition, the side wall 24 is formed by use of a material having anisotropy in coefficient of thermal expansion, for example, and is formed such that the direction in which the coefficient of thermal expansion is larger extends along the direction of the optical axis of the Fresnel lens 22f.

The flanges 27 are provided to, among the four faces of the side wall 24, faces that are opposed to the frame member F1 in a state where the housing 21 is inserted in a housing portion E1 formed by the frame member F1, for example. More specifically, the flanges 27 are respectively provided at portions of those faces on the concentrating portion 22 side along the longitudinal direction thereof. Each flange 27 is molded integrally with the side wall 24 by injection molding using a resin such as PET or PBT, for example.

Each flange 27 is in contact with the upper face of the frame member F1 in a state where the housing 21 corresponding to the flange 27 is inserted in a housing portion E1 formed by the frame member F1. Then, in this state, a bolt not shown is inserted into a mounting hole 28 formed in the flange 27, for example, whereby the housing 21 is fixed to the frame member F1.

Not limited to the configuration in which the housing 21 is fixed to the frame member F1 by the bolt being inserted into the mounting hole 28, the housing 21 may be fixed to the frame member F1 by another method.

Figure 5:
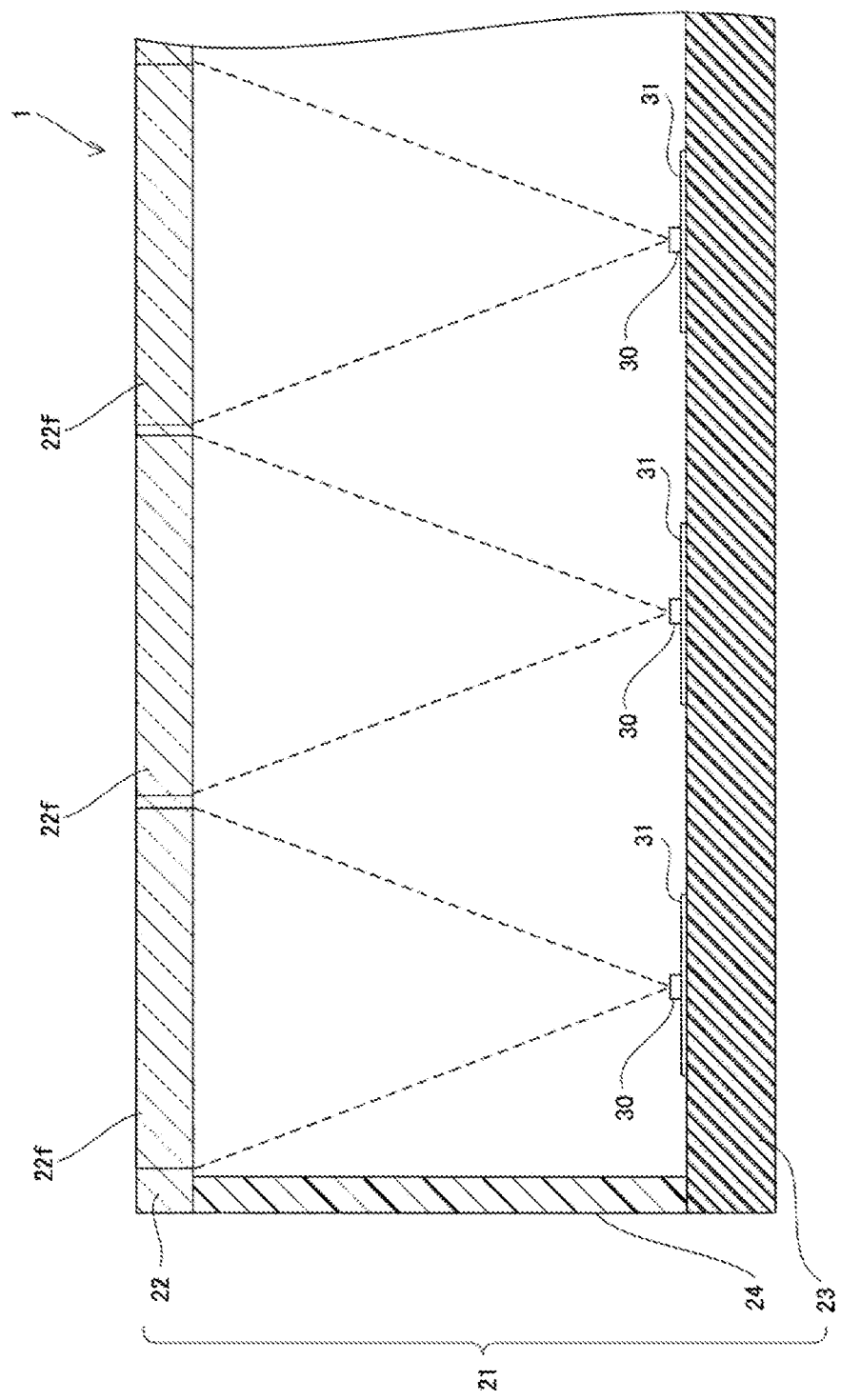
FIG. 5 is a cross-sectional view showing a cross section along a line V-V shown in FIG. 4.

FIG. 5 is a cross-sectional view showing a cross section along a line V-V shown in FIG. 4.

With reference to FIG. 5, the photovoltaic module 1 further includes a plurality of power generating elements 30 and a plurality of FPCs (flexible printed circuits) 31, in addition to the housing 21. The power generating elements 30 and the FPCs 31 are housed in the housing 21.

The plurality of FPCs 31 are arranged in parallel or in substantially parallel to each other in the bottom portion 23, and a plurality of the power generating elements 30 are mounted to each FPC 31.

The power generating elements 30 are provided at positions that correspond to the Fresnel lenses 22f, respectively and receive sunlight concentrated by their corresponding Fresnel lenses 22f to generate power corresponding to the amount of received light. Each power generating element 30 is implemented, as a cell, for example, by a small power generating element including a compound multijunction semiconductor, and specifically, by a small power generating element including a III-V compound semiconductor, for example.

As described above, the photovoltaic module 1 includes: the power generating elements 30 each configured to receive light to generate power; and the housing 21 which is closed and which houses the power generating elements 30. The housing 21 has: the concentrating portion 22 provided with the lenses (Fresnel lenses 22f) configured to concentrate sunlight; the bottom portion 23 in which the power generating elements 30 are disposed; and the side wall 24 serving as the outer frame for the bottom portion 23 and supporting the concentrating portion 22.

[Explanation of Problem]

Figure 6:
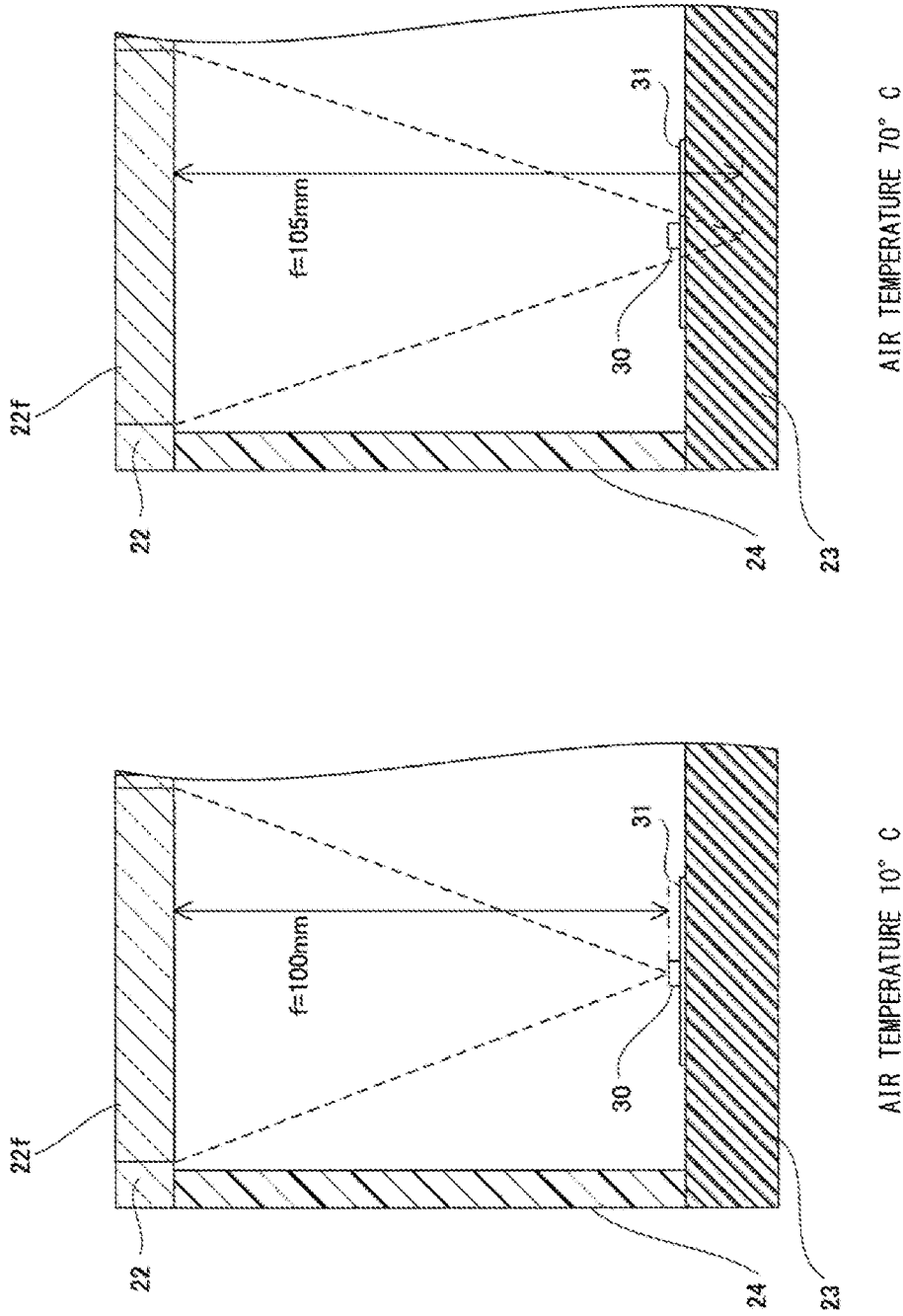
FIG. 6 shows cross-sectional views of a photovoltaic module for explaining a problem.

FIG. 6 shows cross-sectional views of a photovoltaic module for explaining the problem.

In some cases, the photovoltaic apparatus 100 is used in such a place where there is a large air temperature difference. Thus, there are cases where the index of refraction of light or the like changes due to change in air temperature, thus causing the focal length of the Fresnel lens 22f to be changed. Thus, when the focal length of the Fresnel lens 22f has changed, there is a possibility that sunlight cannot be efficiently concentrated on the power generating element 30, thus resulting in decreased power generation efficiency of the photovoltaic apparatus 100.

For example, with reference to FIG. 6, it is assumed that, in an environment where the air temperature is 10° C., a focal length f of the Fresnel lens 22f is 100 mm and the power generation efficiency of the photovoltaic apparatus 100 is 30%. If such a photovoltaic apparatus 100 is used in an environment where the air temperature is 70° C., the focal length f of the Fresnel lens 22f becomes 105 mm, for example, and the power generation efficiency of the photovoltaic apparatus 100 decreases to 26%.

In contrast, in the photovoltaic module 1 according to the present first embodiment, since the side wall 24 is formed from a resin, the side wall 24 expands or contracts in association with change in the air temperature. Specifically, even when the air temperature rises and the focal length f of the Fresnel lens 22f is increased, a distance L between the Fresnel lens 22f and the power generating element 30 is also increased because the side wall 24 expands.

As a result, a large decrease in the light amount of sunlight concentrated by the power generating element 30 can be prevented, and decrease in the power generation efficiency of the photovoltaic apparatus 100 can be suppressed.

Figure 7:
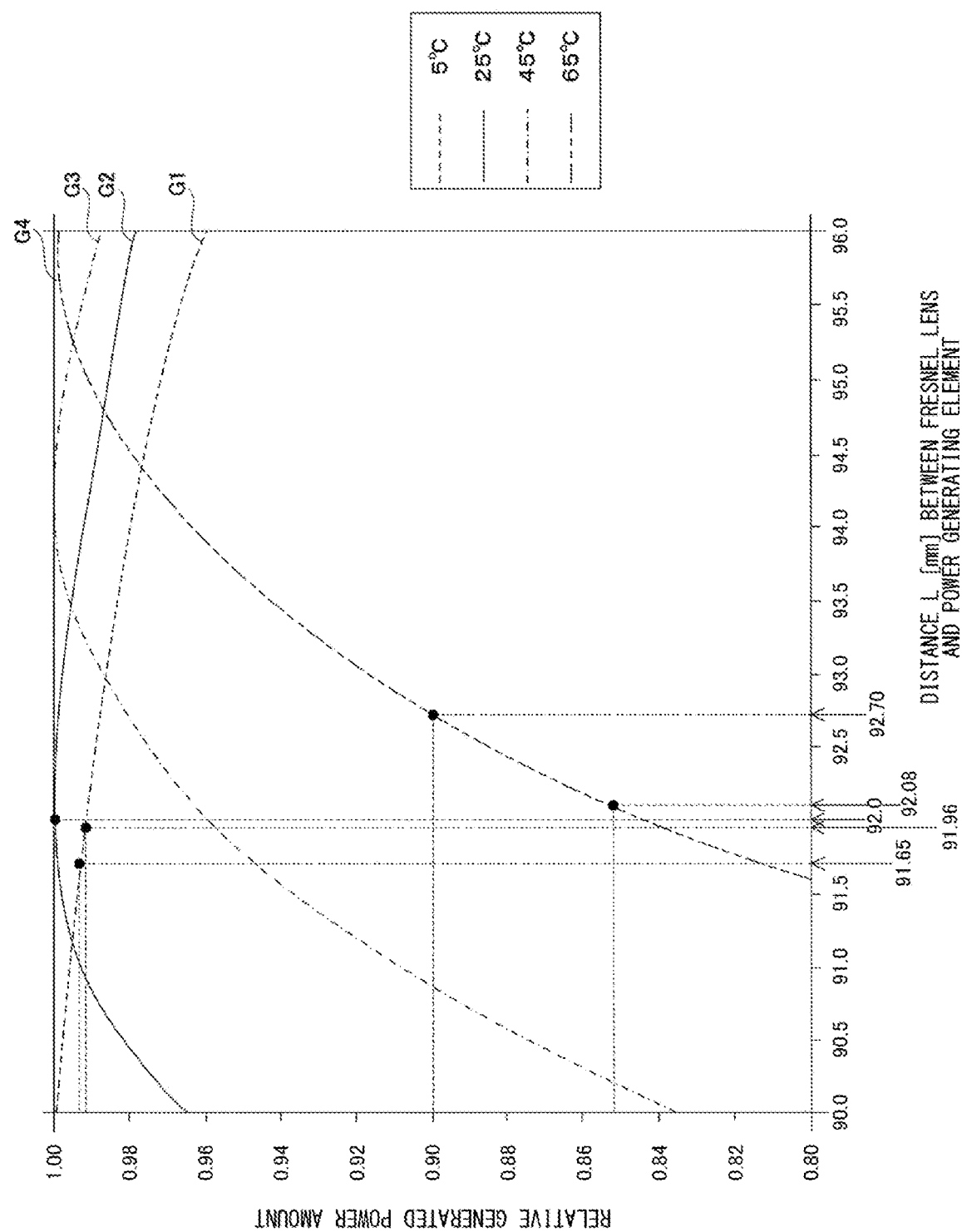
FIG. 7 is a graph showing the relationship among the distance between a Fresnel lens and a power generating element, temperature, and generated power amount.

Comparison Between the Photovoltaic Module According to the First Embodiment and Comparative Example FIG. 7 is a graph showing the relationship among the distance between the Fresnel lens and the power generating element, temperature, and generated power amount. In FIG. 7, the horizontal axis represents the distance L between the Fresnel lens 22f and the power generating element 30, and the vertical axis represents the amount of power generated by the photovoltaic module 1.

In addition, in FIG. 7, graphs G1 to G4 show the relationship of the distance L between the Fresnel lens 22f and the power generating element 30 relative to the generated power amount of the photovoltaic module 1, in environments where the air temperature is 5° C., 25° C., 45° C., and 65° C., respectively.

Here, it is assumed that the side wall 24 of the photovoltaic module 1 according to the first embodiment is formed by use of PBT. Further, it is assumed that the side wall of the photovoltaic module as Comparative example is formed by use of aluminium. Further, it is assumed that the coefficient of thermal expansion of PBT is "190×10E-6" (mm/K) and the coefficient of thermal expansion of aluminium is "24×10E-6" (mm/K).

For example, as shown in graph G2 in FIG. 7, the generated power amount of the photovoltaic module 1 designed such that the distance L between the Fresnel lens 22f and the power generating element 30 is 92 mm at 25° C. is assumed to be "1.00".

Then, when the air temperature decreases from 25° C. to 5° C., the side wall 24 of the photovoltaic module 1 according to the first embodiment contracts by 0.35 mm or substantially 0.35 mm as shown by formula (1) below.

$$92 \text{ mm} \times \Delta 20° \text{ C.} \times 190 \times 10E\text{-}6 \approx 0.35 \text{ mm} \quad (1)$$

That is, in this case, the distance L between the Fresnel lens 22f and the power generating element 30 becomes 91.65 mm or substantially 91.65 mm, as shown by formula (2) below.

$$92 \text{ mm} - 0.35 \text{ mm} = 91.65 \text{ mm} \quad (2)$$

Meanwhile, the side wall 24 of the photovoltaic module as Comparative example contracts by 0.04 mm or substantially 0.04 mm, as shown by formula (3) below.

$$92 \text{ mm} \times \Delta 20° \text{ C.} \times 24 \times 10E\text{-}6 \approx 0.04 \text{ mm} \quad (3)$$

That is, in this case, the distance L between the Fresnel lens 22f and the power generating element 30 becomes 91.96 mm or substantially 91.96 mm as shown in formula (4) below.

$$92 \text{ mm} - 0.04 \text{ mm} = 91.96 \text{ mm} \quad (4)$$

At this time, as shown in graph G1 in FIG. 7, in the environment where the air temperature is 5° C., if the case where the distance L between the Fresnel lens 22f and the power generating element 30 is 91.65 mm is compared with the case where the distance L is 91.96 mm, the relative generated power amount exceeds "0.99" in each case. That is, there is no large difference between the power generation efficiency of the photovoltaic module 1 according to the first embodiment and the power generation efficiency of the photovoltaic module as Comparative example.

Meanwhile, similar comparison is made with respect to a case where the air temperature rises from 25° C. to 65° C., the side wall 24 of the photovoltaic module 1 according to the first embodiment expands by 0.70 mm or substantially 0.70 mm as shown in formula (5) below.

$$92 \text{ mm} \times \Delta 40° \text{ C.} \times 190 \times 10E\text{-}6 \approx 0.70 \text{ mm} \quad (5)$$

That is, in this case, the distance L between the Fresnel lens 22f and the power generating element 30 becomes 92.70 mm or substantially 92.70 mm as shown in formula (6) below.

$$92 \text{ mm} + 0.70 \text{ mm} = 92.70 \text{ mm} \quad (6)$$

Meanwhile, the side wall 24 made from aluminium expands by 0.08 mm or substantially 0.08 mm as shown by formula (7) below.

$$92 \text{ mm} \times \Delta 40° \text{ C.} \times 24 \times 10E\text{-}6 \approx 0.08 \text{ mm} \quad (7)$$

That is, in this case, the distance L between the Fresnel lens 22f and the power generating element 30 becomes 92.08 mm or substantially 92.08 mm as shown by formula (8) below.

$$92 \text{ mm} + 0.08 \text{ mm} = 92.08 \text{ mm} \quad (8)$$

At this time, as shown in graph G4 in FIG. 7, in the environment where the air temperature is 65° C., the case where the distance L the Fresnel lens 22f and the power generating element 30 is 92.70 mm is compared with the case where the distance L is 92.08 mm. That is, the relative generated power amount in the case where the distance L is 92.70 mm is "0.90" or substantially "0.90", whereas the relative generated power amount in the case where the distance L is 92.08 mm becomes "0.85" or substantially "0.85". Thus, compared with the photovoltaic module as Comparative example, the photovoltaic module 1 according to the first embodiment can more suppress decrease in the power generation efficiency.

[Modification]

Figure 8:
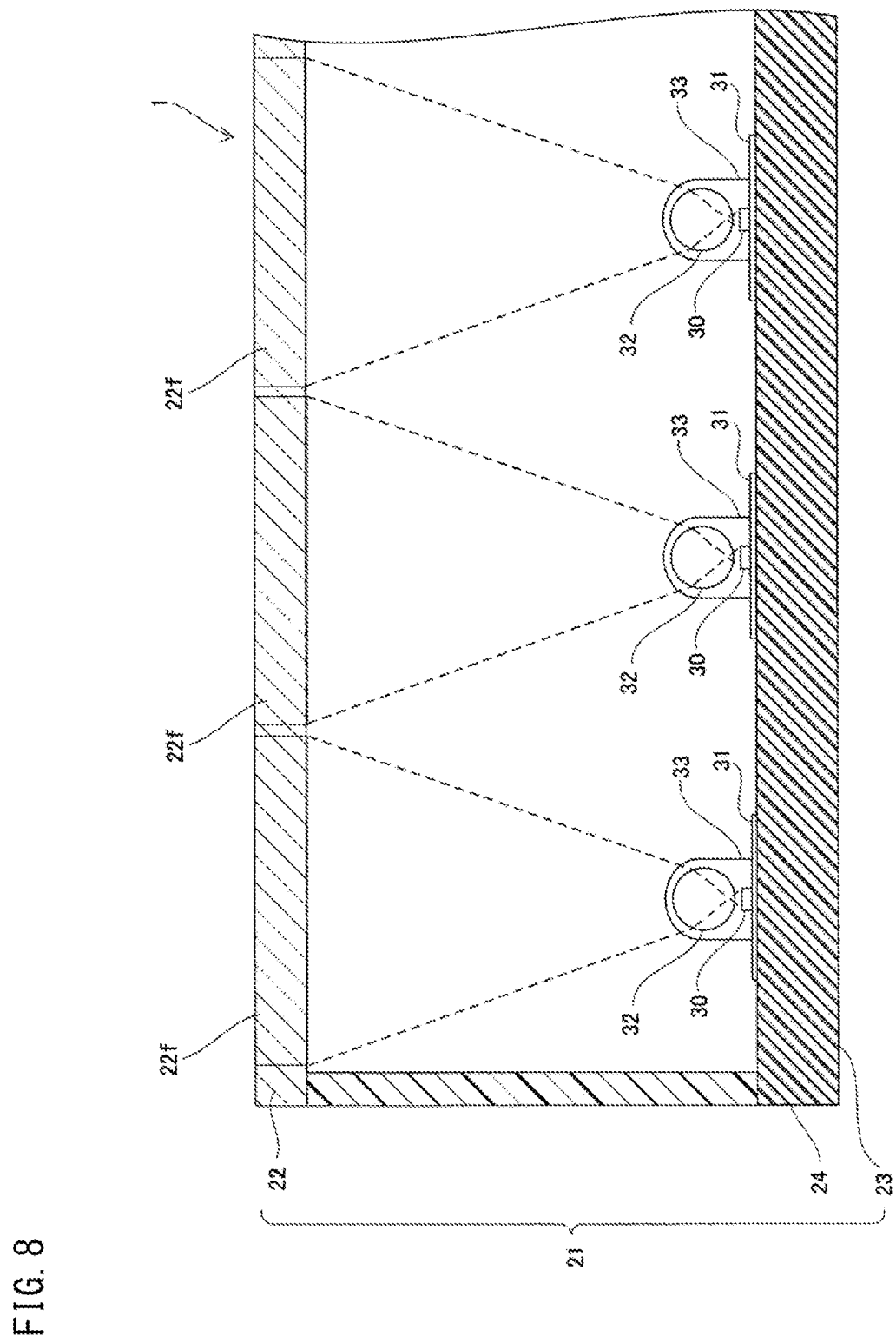
FIG. 8 is a cross-sectional view showing a configuration of a modification of the photovoltaic module according to the first embodiment.

FIG. 8 is a cross-sectional view showing a configuration of a modification of the photovoltaic module according to the first embodiment.

With reference to FIG. 8, the photovoltaic module 1 may further include ball lenses (secondary concentrating portion) 32. Each ball lens 32 is provided between a Fresnel lens 22f and its corresponding power generating element 30. In addition, each ball lens 32 and its corresponding power generating element 30 are mounted to its corresponding FPC 31 in a state of being covered by a light transmitting resin member 33, for example.

Each Fresnel lens 22f concentrates sunlight thereby applying the concentrated sunlight onto its corresponding ball lens 32. Then, the ball lens 32 concentrates the sunlight concentrated by the Fresnel lens 22f onto its corresponding power generating element 30.

Thus, since the ball lens 32 is provided between the Fresnel lens 22f and the power generating element 30, for example, even when the focal length of the Fresnel lens 22f has changed and the distance L between the Fresnel lens 22f and the power generating element 30 no longer matches the focal length, the sunlight can be refracted to a great extent via the ball lens 32, whereby the sunlight can be concentrated on the power generating element 30. That is, even when the distance L between the Fresnel lens 22f and the power generating element 30 cannot be matched with the focal length f of the Fresnel lens 22f only through expansion or contraction of the side wall 24, it is possible to suppress decrease in the power generation efficiency of the photovoltaic apparatus 100.

The photovoltaic module 1 may include a reflection plate or the like provided between the Fresnel lens 22f and the power generating element 30, instead of the ball lens 32, for example. In such a configuration, the reflection plate or the like receives the light concentrated by the Fresnel lens 22f, thereby being able to concentrate the received light onto the power generating element 30.

Meanwhile, the concentrator photovoltaic apparatus described in PATENT LITERATURE 1 has a problem that it is necessary to additionally provide equipment for causing a gas to flow into the housing, equipment for controlling the pressure of the gas, and the like, thus causing high cost. There is also a problem that the degree of freedom in designing is low. This is because, in order to prevent leakage of the gas which has been caused to flow into the housing, it is necessary to make the inside of the housing a sealed space, and to form the housing from a material that can withstand the pressure of the gas.

In contrast, the photovoltaic module 1 according to the first embodiment includes the power generating elements 30 and the housing 21 in which the power generating elements 30 are housed. In addition, the housing 21 includes: the concentrating portion 22 provided with the Fresnel lenses 22f; the bottom portion 23 in which the power generating elements 30 are disposed; and the side wall 24 which connects the concentrating portion 22 and the bottom portion 23, and the side wall 24 is formed from a resin.

With this configuration, when the focal length f of the Fresnel lens 22f changes in association with change in the air temperature, the side wall 24 formed from a resin also expands or contracts in association with the change in the air temperature, whereby the distance L between the Fresnel lens 22f and the power generating element 30 changes. Thus, even when the focal length f of Fresnel lens 22f has changed, a large decrease in the light amount of sunlight concentrated by the power generating element 30 can be prevented, and decrease in the power generation efficiency of the photovoltaic module 1 can be suppressed. Accordingly, a further excellent photovoltaic module can be provided.

For example, when compared with the concentrator photovoltaic apparatus described in PATENT LITERATURE 1, it is not necessary to additionally provide the equipment for causing a gas to flow into the housing, equipment for controlling the pressure of the gas, and the like. Thus, the cost can be kept at a low level. Further, when compared with the concentrator photovoltaic apparatus described in PATENT LITERATURE 1, it is not necessary to make the inside of the housing a sealed space, and to form the housing from a material that can withstand the pressure of the gas. Thus, the degree of freedom in designing can be enhanced.

In the photovoltaic module 1 according to the first embodiment, the Fresnel lens 22f includes: a glass substrate; and a silicone resin or an acrylic resin provided on the glass substrate. In addition, the side wall 24 is formed by use of PET or PBT.

With this configuration, the amount of change in the focal length f of the Fresnel lens 22f in association with change in the air temperature can be made close to the amount of change in the distance L between the Fresnel lens 22f and the power generating element 30 due to expansion or contraction of the side wall 24 in association with the change in the air temperature. Thus, decrease in the power generation efficiency of the photovoltaic module 1 can be effectively suppressed. In addition, strength necessary for the side wall 24 can be ensured.

In the photovoltaic module 1 according to the first embodiment, the side wall 24 is formed by use of a material having anisotropy in coefficient of thermal expansion, and is formed such that the direction in which the coefficient of thermal expansion is larger extends along the direction of the optical axis of the Fresnel lens 22f.

With this configuration, the amount of the change in the distance L between the Fresnel lens 22f and the power generating element 30 in association with the change in the air temperature is further increased. Thus, it is possible to enhance the possibility that the amount of the change in the distance L between the Fresnel lens 22f and the power generating element 30 will follow the amount of the change in the focal length f of the Fresnel lens 22f in association with the change in the air temperature.

The photovoltaic module 1 according to the first embodiment further includes the ball lens 32 provided between each Fresnel lens 22f and its corresponding power generating element 30. The ball lens 32 receives light concentrated by the Fresnel lens 22f and causes the received light to be concentrated on its corresponding power generating element 30.

With this configuration, for example, even when the focal length f of the Fresnel lens 22f has changed and the distance L between the Fresnel lens 22f and the power generating element 30 no longer matches the focal length f, the sunlight can be refracted to a great extent via the ball lens 32, whereby the sunlight can be concentrated on the power generating element 30. That is, even when the distance L between the Fresnel lens 22f and the power generating element 30 cannot be matched with the focal length f of the Fresnel lens 22f only through expansion or contraction of the side wall 24, it is possible to suppress decrease in the power generation efficiency of the photovoltaic apparatus 100. Thus, it is possible to enhance the degree of freedom in designing such as adjustment of the size of the housing 21 or selection of the material of the side wall 24.

Next, another embodiment will be described with reference to the drawings. The same or corresponding components are denoted by the same reference signs, and the description thereof is not repeated.

Second Embodiment

[Configuration of Photovoltaic Module]

Figure 9:
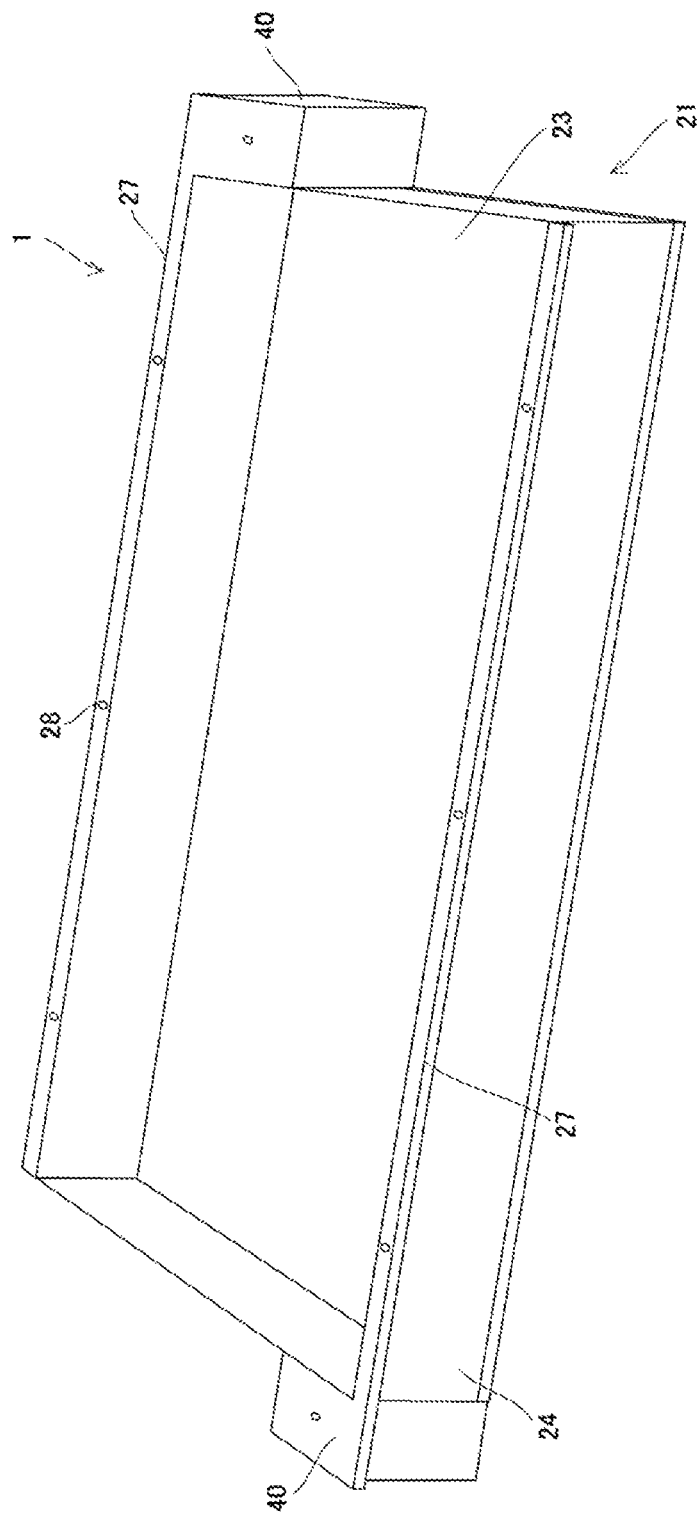
FIG. 9 is a perspective view showing a configuration of a housing of a photovoltaic module according to a second embodiment.

FIG. 9 is a perspective view showing a configuration of the housing of the photovoltaic module according to the second embodiment. In FIG. 9, the concentrating portion 22, the power generating elements 30, and the FPCs 31 are not shown. Here, features that are different from those of the photovoltaic module 1 according to the first embodiment described above will be mainly described.

With reference to FIG. 9, compared with the housing 21 according to the first embodiment described above, the housing 21 of this photovoltaic module 1 further includes an optical-axis confirmation portion 40 for confirming the optical axis of incident light incident on the photovoltaic module 1.

For example, when the photovoltaic module 1 is to be mounted to the pedestal 2, an operator confirms the optical axis of incident light incident on each photovoltaic module 1, by using the optical-axis confirmation portion 40 provided to the photovoltaic module 1. Specifically, the operator adjusts the orientation of each photovoltaic module 1 such that the optical axis of the incident light becomes perpendicular or substantially perpendicular to the concentrating portion 22 of each photovoltaic module 1, and mounts the photovoltaic modules 1 one by one to the pedestal 2.

The optical-axis confirmation portion 40 is molded integrally with the side wall 24 and the flange 27 by injection molding using a resin such as PET or PBT, for example. The optical-axis confirmation portion 40 is provided to, among the four faces of the side wall 24, a face other than the faces that are opposed to the frame member F1 in a state where the housing 21 corresponding to the optical-axis confirmation portion 40 is fixed to the frame member F1.

That is, the optical-axis confirmation portion 40 is provided to, among the faces of the side wall 24, a face that is not provided with the flange 27. In a case where, among the faces of the side wall 24, there are a plurality of faces that are not provided with the flanges 27, it is sufficient that the optical-axis confirmation portion 40 is provided to at least one of such plurality of faces.

[Configuration of Optical-Axis Confirmation Portion]

Figure 10:
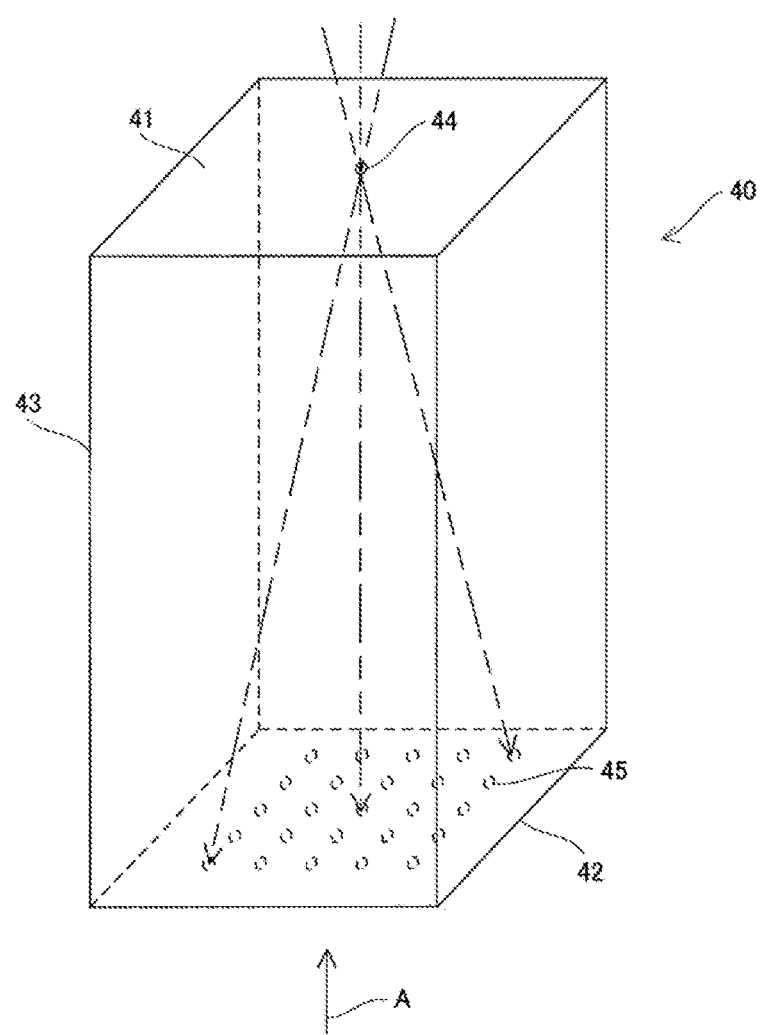
FIG. 10 is a perspective view showing a configuration of an optical-axis confirmation portion shown in FIG. 9.
Figure 11:
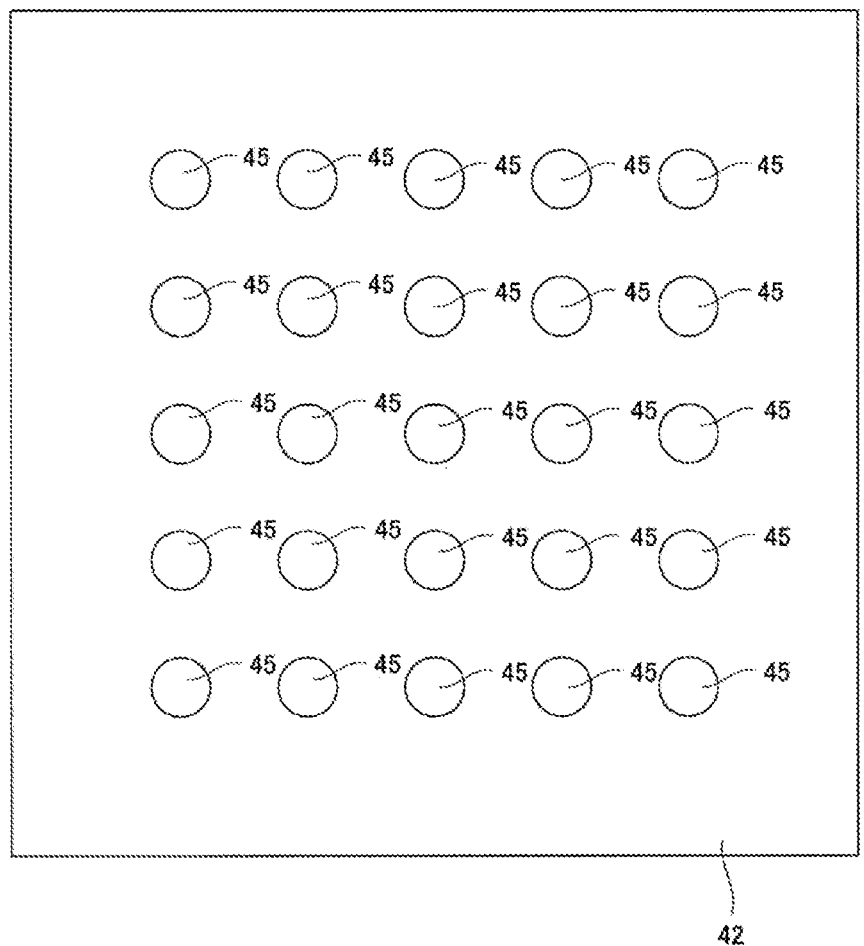
FIG. 11 shows a state where the bottom face of the optical-axis confirmation portion is viewed from the direction of an arrow A shown in FIG. 10.

FIG. 10 is a perspective view showing a configuration of the optical-axis confirmation portion shown in FIG. 9. FIG. 11 shows a state where the bottom face of the optical-axis confirmation portion is viewed from the direction of an arrow A shown in FIG. 10.

With reference to FIG. 10 and FIG. 11, the optical-axis confirmation portion 40 is a rectangular parallelepiped housing, for example. The optical-axis confirmation portion 40 has: an upper face 41; a bottom face 42 provided to the farther side relative to the upper face 41 in the advancing direction of incident light; and a side face 43. The upper face 41 and the bottom face 42 are provided in parallel or substantially parallel to the face of the concentrating portion 22 of the housing 21.

An intake hole 44 is formed at the center or substantially at the center of the upper face 41, the intake hole 44 being for guiding the incident light to the interior space of the optical-axis confirmation portion 40 formed by the upper face 41, the bottom face 42, and the side face 43.

A plurality of visual confirmation holes 45 are formed in the bottom face 42, the visual confirmation holes 45 being for confirming the optical axis of incident light having been guided to the interior space of the optical-axis confirmation portion 40. The incident light having been guided to the interior space of the optical-axis confirmation portion 40 passes through one of the plurality of the visual confirmation holes 45, to be guided to the outside of the optical-axis confirmation portion 40, for example.

Then, by viewing the bottom face 42 from the direction of the arrow A shown in FIG. 10, the operator can confirm the optical axis of the incident light on the photovoltaic module 1. For example, if the operator views the bottom face 42 and confirms that, among the plurality of the visual confirmation holes 45, a visual confirmation hole 45 located at the center or substantially at the center of the bottom face 42 is illuminated, that is, if the operator confirms that incident light is passing through that visual confirmation hole 45, it is possible to determine that the optical axis of the incident light on the photovoltaic module 1 is perpendicular or substantially perpendicular to the face of the concentrating portion 22 of the photovoltaic module 1.

On the other hand, if the operator confirms that, among the plurality of the visual confirmation holes 45, a visual confirmation hole 45 other than the visual confirmation hole 45 located at the center or substantially at the center of the bottom face 42 is illuminated, or if the operator confirms that none of the visual confirmation holes 45 is illuminated, it is possible to determine that the optical axis of the incident light on the photovoltaic module 1 is not perpendicular or is not substantially perpendicular to the face of the concentrating portion 22 of the photovoltaic module 1.

[Configuration (Modification 1) of Optical-Axis Confirmation Portion]

Figure 12:
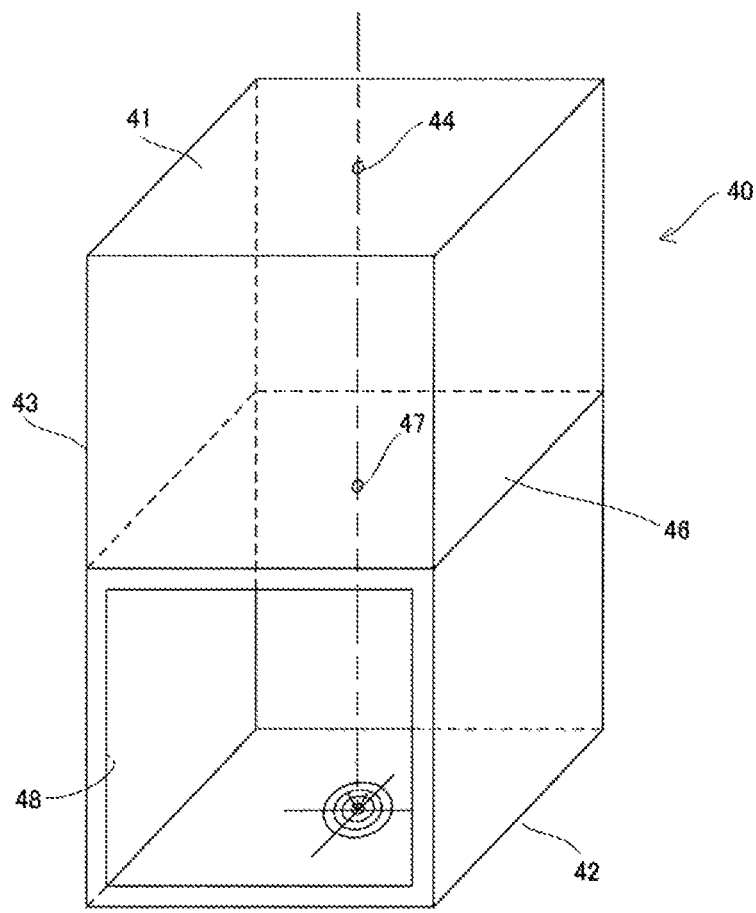
FIG. 12 is a perspective view showing a configuration (Modification 1) of the optical-axis confirmation portion shown in FIG. 9.

FIG. 12 is a perspective view showing a configuration (Modification 1) of the optical-axis confirmation portion shown in FIG. 9.

With reference to FIG. 12, the optical-axis confirmation portion 40 according to Modification 1 has the upper face 41, the bottom face 42, and the side face 43, as in the case of the optical-axis confirmation portion 40 shown in FIG. 10. Except the contents described below, the optical-axis confirmation portion 40 according to Modification 1 and the optical-axis confirmation portion 40 shown in FIG. 10 have the same configuration.

The optical-axis confirmation portion 40 according to Modification 1 has an intermediate face 46 provided in the interior space of the optical-axis confirmation portion 40 and located between the upper face 41 and the bottom face 42. This intermediate face 46 is parallel or substantially parallel to the upper face 41 and the bottom face 42. A passage hole 47 is formed at the center or substantially at the center of the intermediate face 46.

When incident light is incident on the upper face 41 at a predetermined angle, the incident light can pass through the passage hole 47 and reach the bottom face 42. Specifically, when incident light is incident on the upper face 41 perpendicularly or substantially perpendicularly thereto, the incident light passes through the passage hole 47 and reaches the bottom face 42. On the other hand, when incident light is incident on the upper face 41 at an angle other than the right angle or substantially right angle, the incident light cannot pass through the passage hole 47 and does not reach the bottom face 42.

In the optical-axis confirmation portion 40 according to Modification 1, the visual confirmation hole 45 is not formed in the bottom face 42. In the optical-axis confirmation portion 40 according to Modification 1, a visual confirmation window 48 is formed at the side face 43 on the bottom face 42 side relative to the intermediate face 46, the visual confirmation window 48 being for confirming whether the incident light has reached the bottom face 42. By viewing the inside of the optical-axis confirmation portion 40 through the visual confirmation window 48, the operator can confirm whether the incident light having been guided to the interior space of the optical-axis confirmation portion 40 has reached the bottom face 42.

That is, if the operator confirms that the incident light has reached the bottom face 42, the operator can determine that the optical axis of the incident light on the photovoltaic module 1 is perpendicular or substantially perpendicular to the face of the concentrating portion 22 of the photovoltaic module 1. On the other hand, if the operator confirms that the incident light has not reached the bottom face 42, the operator can determine that the optical axis of the incident light on the photovoltaic module 1 is not perpendicular or is not substantially perpendicular to the face of the concentrating portion 22 of the photovoltaic module 1.

[Configuration (Modification 2) of Optical-Axis Confirmation Portion]

Figure 13:
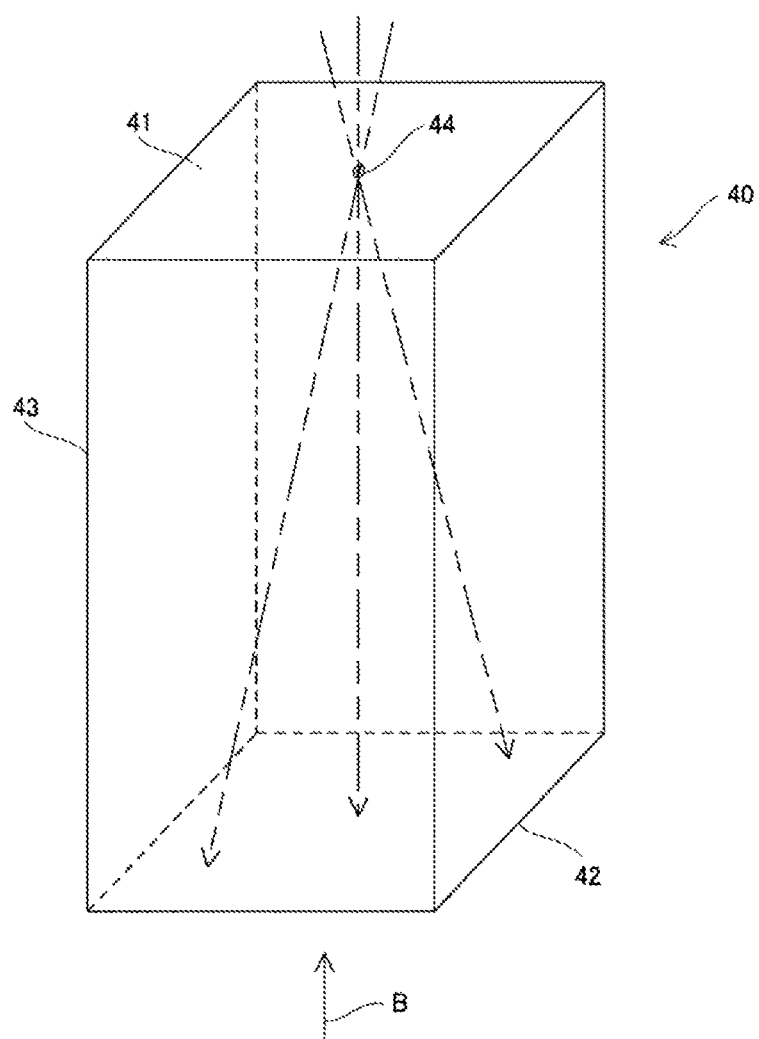
FIG. 13 is a perspective view showing a configuration (Modification 2) of the optical-axis confirmation portion shown in FIG. 9.
Figure 14:
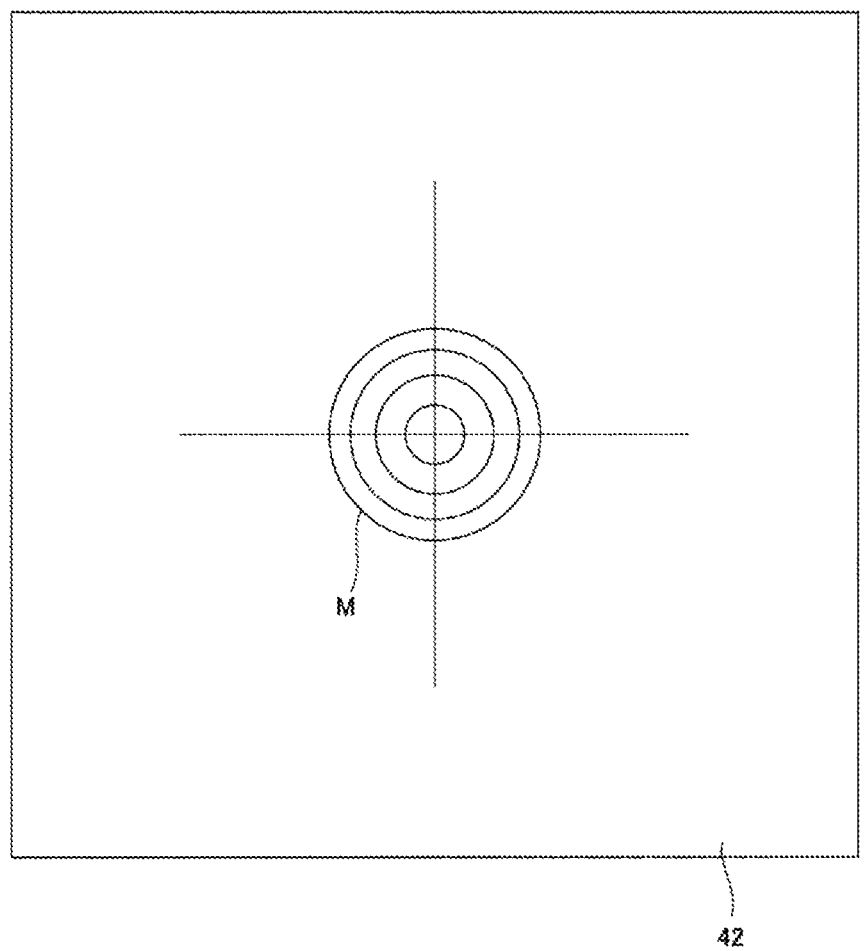
FIG. 14 shows a state where the bottom face of the optical-axis confirmation portion is viewed from the direction of an arrow B shown in FIG. 13.

FIG. 13 is a perspective view showing a configuration (Modification 2) of the optical-axis confirmation portion shown in FIG. 9. FIG. 14 shows a state where the bottom face of the optical-axis confirmation portion is viewed from the direction of an arrow B shown in FIG. 13.

With reference to FIG. 13 and FIG. 14, the optical-axis confirmation portion 40 according to Modification 2 has the upper face 41, the bottom face 42, and the side face 43, as in the case of the optical-axis confirmation portion 40 shown in FIG. 10. Except the contents described below, the optical-axis confirmation portion 40 according to Modification 2 and the optical-axis confirmation portion 40 shown in FIG. 10 have the same configuration.

In the optical-axis confirmation portion 40 according to Modification 2, the bottom face 42 is formed by use of a light-transmitting material. For example, by performing insert molding such that the bottom face 42 is embedded, it is possible to manufacture the optical-axis confirmation portion 40 easily and at low cost. The visual confirmation hole 45 is not formed in the bottom face 42.

Since the bottom face 42 is formed by use of a light-transmitting material, if the operator views the bottom face 42 from the direction of the arrow B shown in FIG. 13, the operator can confirm which position on the bottom face 42 the incident light having been guided to the interior space of the optical-axis confirmation portion 40 has reached.

By confirming in this manner which position on the bottom face 42 the incident light having been guided to the interior space of the optical-axis confirmation portion 40 has reached, the operator can confirm the optical axis of the incident light on the photovoltaic module 1. For example, as shown in FIG. 14, a mark M indicating the center or the approximate center of the bottom face 42 is provided on the bottom face 42. By using the mark M, the operator can confirm whether the incident light having been guided to the interior space of the optical-axis confirmation portion 40 has reached the center or the approximate center of the bottom face 42.

That is, if the operator confirms that the center or the approximate center of the mark M provided to the bottom face 42 is illuminated, the operator can determine that the optical axis of the incident light on the photovoltaic module 1 is perpendicular or substantially perpendicular to the face of the concentrating portion 22 of the photovoltaic module 1. On the other hand, if the operator confirms that a place other than the center or the approximate center of the mark M provided to the bottom face 42 is illuminated, the operator can determine that the optical axis of the incident light on the photovoltaic module 1 is not perpendicular or is not substantially perpendicular to the face of the concentrating portion 22 of the photovoltaic module 1.

The other configurations are the same as those of the photovoltaic apparatus 100 according to the first embodiment described above, and thus, detailed description thereof is not repeated here.

Meanwhile, the concentrator solar generator described in PATENT LITERATURE 2 has a problem that it is necessary to additionally use a new member for confirming the optical axis of incident light, thus causing high cost. In addition, there is a problem that, in order to ensure the optical axis accuracy, high assembling accuracy is required at the time of assembling the device for confirming the optical axis.

In contrast, the photovoltaic module 1 according to the second embodiment includes: the power generating elements 30; and the housing 21 in which the power generating elements 30 are housed. Further, the photovoltaic module 1 includes the optical-axis confirmation portion 40 formed integrally with the side wall 24 of the housing 21 and for confirming the optical axis of incident light incident on the photovoltaic module 1 which includes the optical-axis confirmation portion 40.

With this configuration, it is not necessary to additionally use a new member for confirming the optical axis of the incident light, and thus, low cost can be realized. In addition, high assembling accuracy for ensuring the optical axis accuracy is not required. Therefore, a further excellent photovoltaic module can be provided.

In the photovoltaic module 1 according to the second embodiment, the side wall 24 and the optical-axis confirmation portion 40 are formed integrally with each other by use of a resin.

With this configuration, for example, by performing injection molding, it is possible to manufacture the side wall 24 and the optical-axis confirmation portion 40 relatively easily and at low cost.

In the photovoltaic module 1 according to the second embodiment, the optical-axis confirmation portion 40 includes the upper face 41 and the bottom face 42. In addition, the intake hole 44 is formed in the upper face 41, the intake hole 44 being for guiding the incident light to the interior space of the optical-axis confirmation portion 40. Further, the plurality of the visual confirmation holes 45 are formed in the bottom face 42, the visual confirmation holes 45 for confirming the optical axis of the incident light having been guided to the interior space.

With this configuration, if the visual confirmation hole 45 through which light is passing is identified from among the plurality of the visual confirmation holes 45, it is possible to easily confirm the optical axis of the incident light. In addition, the side wall 24 and the optical-axis confirmation portion 40 can be formed from the same material. Thus, for example, by performing injection molding, it is possible to manufacture the side wall 24 and the optical-axis confirmation portion 40 relatively easily and at low cost.

In the photovoltaic module 1 according to the second embodiment, the optical-axis confirmation portion 40 includes the upper face 41, the bottom face 42, and the intermediate face 46 provided between the upper face 41 and the bottom face 42. In addition, the intake hole 44 is formed in the upper face 41, the intake hole 44 being for guiding the incident light to the interior space of the optical-axis confirmation portion 40. Further, the passage hole 47 is formed in the intermediate face 46, the passage hole 47 for allowing light having been incident on the upper face 41 at a predetermined angle to pass therethrough to reach the bottom face 42.

With this configuration, by confirming whether light has reached the bottom face 42 of the optical-axis confirmation portion 40, it is possible to easily confirm whether the incident light is incident at a predetermined angle on the upper face 41 of the photovoltaic module 1. In addition, the side wall 24 and the optical-axis confirmation portion 40 can be formed from the same material. Therefore, for example, by performing injection molding, it is possible to manufacture the side wall 24 and the optical-axis confirmation portion 40 relatively easily and at low cost.

In the photovoltaic module 1 according to the second embodiment, the optical-axis confirmation portion 40 includes the upper face 41 and the bottom face 42. In addition, the intake hole 44 is formed in the upper face 41, the intake hole 44 being for guiding the incident light to the interior space of the optical-axis confirmation portion 40. Further, the bottom face 42 is formed by use of a light-transmitting material.

With this configuration, by viewing the optical-axis confirmation portion 40 from the bottom face 42 side, for example, it is possible to confirm which position on the bottom face 42 the light has reached. Thus, it is possible to easily confirm the optical axis of the incident light. Since work and the like for forming many holes is not required, the photovoltaic module 1 including the optical-axis confirmation portion 40 can be manufactured at low cost.

In the photovoltaic module 1 according to the second embodiment, the housing 21 is fixed to the frame member F1. In addition, the optical-axis confirmation portion 40 is provided to, among the faces of the side wall 24, a face other than the faces that are opposed to the frame member F1 in a state where the housing 21 corresponding to the optical-axis confirmation portion 40 is fixed to the frame member F1.

With this configuration, it is not necessary to take into consideration of the presence of the optical-axis confirmation portion 40 when fixing the housing 21 to the frame member F1. With this relatively low-cost and simple configuration, a photovoltaic module including an optical-axis confirmation portion can be realized.

Third Embodiment

Figure 15:
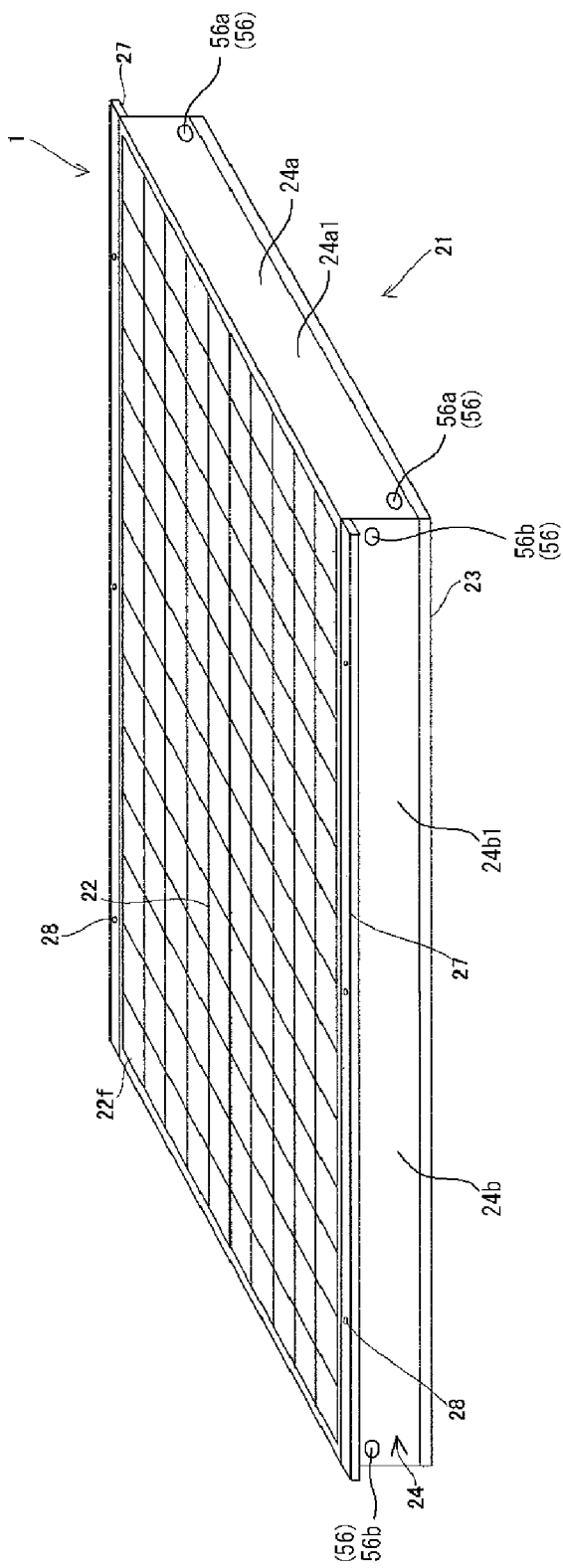
FIG. 15 is a perspective view showing the appearance of a photovoltaic module according to a third embodiment.

FIG. 15 is a perspective view showing the appearance of a photovoltaic module according to a third embodiment.

The side wall 24 of the present embodiment is a resin molded body including a resin and glass fibers dispersed in the resin. In this point, the side wall 24 of the present embodiment is different from the side wall 24 of each embodiment above.

Figure 16:
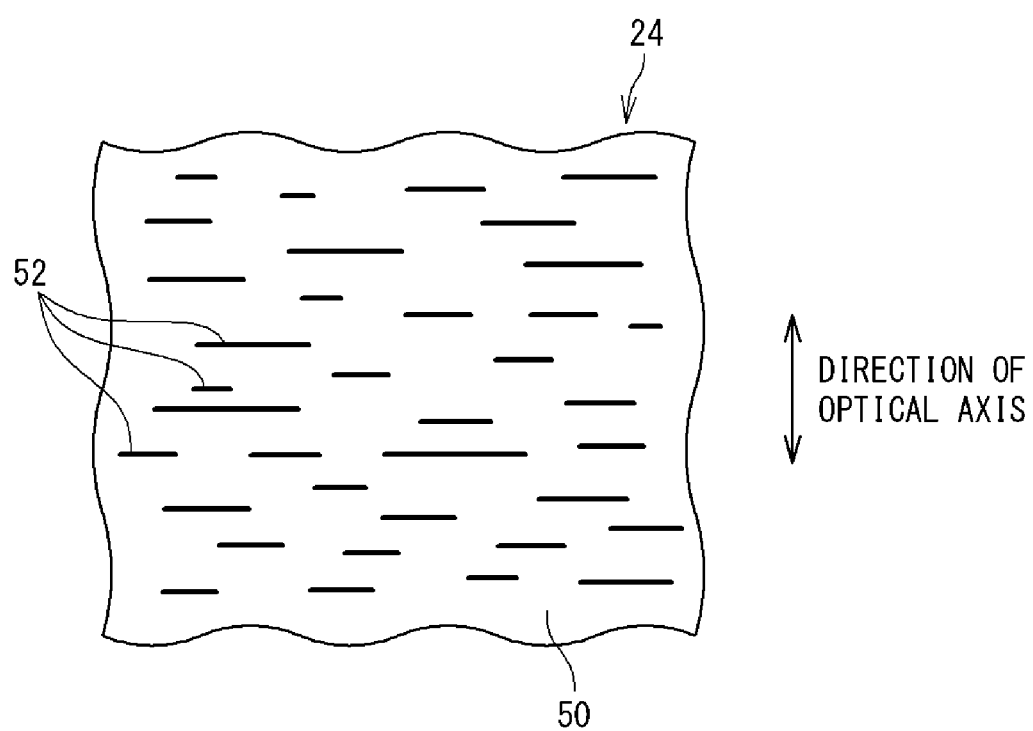
FIG. 16 is an enlarged diagram of a part of a side wall, and schematically shows a state of glass fibers dispersed in a resin.

FIG. 16 is a diagram of an enlarged diagram of a part of the side wall 24, and schematically shows a state of glass fibers dispersed in the resin. In FIG. 16, as indicated by an arrow, the up-down direction in the drawing is the direction of the optical axis of the Fresnel lens 22f (FIG. 5) of the concentrating portion 22.

As shown in FIG. 16, the side wall 24 being a resin molded body includes a resin 50 serving as a matrix, and a large number of glass fibers 52. The large number of glass fibers 52 are dispersed in the resin 50. Each glass fiber 52 has a thin needle-like shape.

As the resin 50, any one of PET (Polyethylene terephthalate), PBT (Polybutylene Terephthalate), and PP (Polypropylene) is used.

Here, as shown in FIG. 16, the longitudinal direction of each glass fiber 52 in the resin 50 extends along a crossing direction that crosses the direction of the optical axis of the Fresnel lens 22f. That is, the large number of glass fibers 52 are orientated along the crossing direction.

Therefore, the coefficient of thermal expansion of the side wall 24 (resin molded body) in the crossing direction is dependent on the coefficient of thermal expansion of the glass fiber 52. In addition, the coefficient of thermal expansion of the side wall 24 (resin molded body) in the direction of the optical axis of the Fresnel lens 22f is dependent on the coefficient of thermal expansion of the resin 50.

The coefficient of thermal expansion of the resin 50 is greater than the coefficient of thermal expansion of the glass fiber 52. Thus, the coefficient of thermal expansion of the side wall 24 in the direction of the optical axis of the Fresnel lens 22f is greater than the coefficient of thermal expansion of the side wall 24 in the crossing direction. That is, the side wall 24 has anisotropy in coefficient of thermal expansion, and is formed such that the direction in which the coefficient of thermal expansion is greater extends along the direction of the optical axis of the Fresnel lens 22f.

Accordingly, even when the focal length f of the Fresnel lens 22f is increased due to rise of the air temperature, the distance L between the Fresnel lens 22f and the power generating element 30 is also increased because the side wall 24 appropriately expands. As a result, a large decrease in the light amount of sunlight concentrated to the power generating element 30 can be prevented, and decrease in the power generation efficiency of the photovoltaic apparatus 100 can be suppressed.

Thus, according to the present embodiment, decrease in the power generation efficiency of the photovoltaic apparatus 100 due to change in the air temperature can be suppressed.

Meanwhile, since the coefficient of thermal expansion of the side wall 24 in the crossing direction is relatively small, change in the shape of the side wall 24 in the crossing direction due to change in the air temperature can be suppressed. As a result, the side wall 24 can appropriately support the concentrating portion 22 irrespective of change in the air temperature.

As shown in FIG. 15, the side wall 24 of the present embodiment includes a plurality of gate marks 56 which are each a trace of a gate used at injection molding.

The side wall 24 has a rectangular frame shape. The side wall 24 includes a pair of short-side wall portions 24a and a pair of long-side wall portions 24b.

The pair of short-side wall portions 24a and the pair of long-side wall portions 24b each include gate marks 56. Thus, a plurality of gate marks 56 include short-side gate marks 56a provided to the short-side wall portions 24a and long-side gate marks 56b provided to the long-side wall portions 24b.

Each short-side wall portion 24a includes a pair of short-side gate marks 56a. The pair of short-side gate marks 56a are provided at both end portions in the crossing direction of an outer face 24a1 of the short-side wall portion 24a.

The pair of short-side gate marks 56a are provided on the bottom portion 23 side, in the direction of the optical axis, of the outer face 24a1.

Each long-side wall portion 24b includes a pair of long-side gate marks 56b. The pair of long-side gate marks 56b are provided at both end portions in the crossing direction of an outer face 24b1 of the long-side wall portion 24b.

The pair of long-side gate marks 56b are provided on the concentrating portion 22 side, in the direction of the optical axis, of the outer face 24b1.

Each gate mark 56a, 56b is provided in a vicinity of a corner portion that is continuous to a pair of wall portions adjacent to each other among the wall portions 24a, 24b. Accordingly, each gate mark 56a, 56b functions as a rib in the vicinity of the corner portion, thereby being able to increase the strength of the housing 21.

In the present embodiment, a pair of gate marks 56 are provided to the outer face 24a1, 24b1 of each wall portion 24a, 24b. That is, the gate marks 56 are provided at eight positions in the side wall 24.

In the present embodiment, since each wall portion 24a, 24b includes the gate marks 56, gates of a metal mold for molding the side wall 24 are provided at portions, in the metal mold, that correspond to the wall portions 24a, 24b, as described later.

Figure 17:
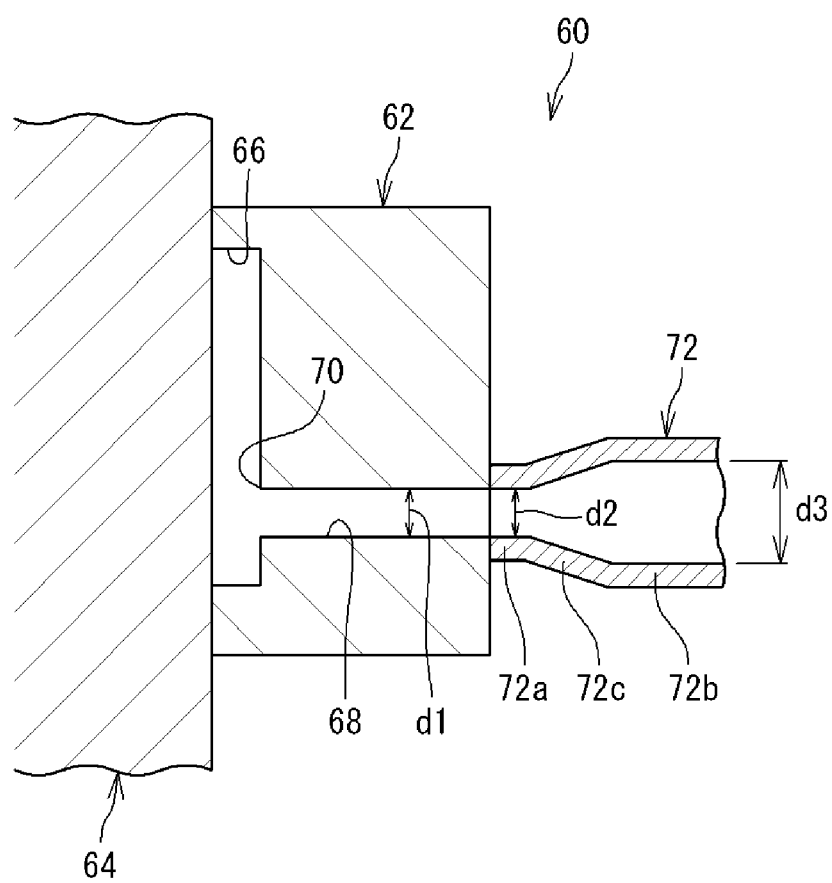
FIG. 17 is a partial cross-sectional view of a metal mold for forming the side wall.

FIG. 17 is a partial cross-sectional view of a metal mold for forming the side wall 24.

In FIG. 17, a metal mold 60 includes: an outside block 62; and an inside block 64 used in combination with the inside surface of the outside block 62. The metal mold 60 includes a cavity 66, a runner 68, and a gate 70 through which the runner 68 is continuous to the cavity 66.

A tube-shaped hot runner portion 72 continuous to an injection apparatus (not shown) for injecting the resin 50 containing the glass fibers 52 is connected to the outside block 62.

The hot runner portion 72 includes: a connection portion 72a continuous to the metal mold 60; a resin introduction portion 72b on the injection apparatus side; and a tapered portion 72c continuous to the connection portion 72a and the resin introduction portion 72b.

The resin 50 injected from the injection apparatus is provided to the hot runner portion 72. The resin 50 contains the glass fibers 52. The hot runner portion 72 includes a heater (not shown) for maintaining the resin 50 in a molten state. Thus, the resin 50 in the hot runner portion 72 is maintained in a molten state.

The resin 50 containing the glass fibers 52 passes the hot runner portion 72 to reach the runner 68, and then passes the gate 70 to be injected into the cavity 66. The resin 50 containing the glass fibers 52 and having being injected into the cavity 66 is cured in the cavity 66 to be the side wall 24, which is a resin molded body.

The obtained side wall 24 is taken out from the metal mold 60.

The side wall 24 immediately after being taken out from the metal mold 60 has protrusions formed as a result of the resin 50 having been cured in the runner 68. Although the protrusions are removed, the marks at which the protrusions have been removed become the gate marks 56.

As described above, each wall portion 24a, 24b includes the gate marks 56 (FIG. 15). Thus, the gate 70 and the runner 68 of the metal mold 60 are provided at each of portions corresponding to the wall portions 24a, 24b in the metal mold 60.

Therefore, the injection state of the molten resin 50 containing the glass fibers 52 can be individually adjusted at each of the gates corresponding to the wall portions 24a, 24b. As a result, variation, in the orientation direction of the glass fibers 52, that occurs between the wall portions 24a, 24b can be suppressed. Further, it becomes easy to inject the glass fibers 52 contained in the molten resin 50 while orienting the glass fibers 52 in a predetermined direction.

The gate marks 56 of the side wall 24 are provided at both end portions in the crossing direction of the outer face 24a1, 24b1 of each wall portion 24a, 24b (FIG. 15). Therefore, the gate 70 and the runner 68 are provided at each of portions, in the metal mold 60, that correspond to both end portions in the crossing direction of the outer face 24a1, 24b1 of each wall portion 24a, 24b.

In this case, the resin for forming one wall portion 24 is injected from two gates 70 separated in the crossing direction. Therefore, variation, in the orientation direction of the glass fibers 52, that occurs in each wall portion 24a, 24b can be suppressed.

Further, each gate is provided in a vicinity of a corner portion that is continuous to a pair of wall portions 24a, 24b adjacent to each other among the wall portions 24a, 24b. Thus, distortion and unevenness in strength of the side wall 24 can be suppressed.

Here, it is assumed that, in the side wall 24, the long side is 1000 mm long, the short side is 700 mm long, the height along the direction of the optical axis is 200 mm, and the thickness of the side wall 24 is 2 mm.

In this case, an inner diameter d1 of the runner 68 is set to 5 mm.

Further, an inner diameter d2 of the connection portion 72a of the hot runner portion 72 is also set to 5 mm.

Furthermore, an inner diameter d3 of the resin introduction portion 72b of the hot runner portion 72 is set to 10 mm.

When the inner diameter d2 of the connection portion 72a of the hot runner portion 72 and the inner diameter d1 of the runner 68 are set to be smaller than the inner diameter d3 of the resin introduction portion 72b of the hot runner portion 72 in this manner, the flow rate of the resin containing the glass fibers 52 can be increased, and control in the orientation direction of the glass fibers 52 in the resin 50 is facilitated.

The content proportion of the glass fibers 52 relative to the total weight of the resin 50 and the glass fibers 52 is preferably not less than 5 weight % and not higher than 40 weight %.

When the content proportion is less than 5 weight %, strength of the side wall 24 could be decreased more than necessary. When the content proportion exceeds 40 weight %, the molten resin 50 is less likely to smoothly flow in the metal mold for molding, and thus, a hollow or a warp could be caused in the side wall 24.

When the content proportion is set to be not less than 5 weight % and not higher than 40 weight %, an appropriate side wall 24 can be obtained.

The length of each glass fiber 52 can be not less than 0.1 mm and not greater than 3 mm, and the diameter of the glass fiber 52 can be not less than 1 μm and not greater than 50 μm.

When the length of the glass fiber 52 is smaller than 0.1 mm, sufficient contribution to the coefficient of thermal expansion of the side wall 24 cannot be obtained. When the length of the glass fiber 52 is greater than 3 mm, the molten resin 50 containing the glass fibers 52 is less likely to smoothly flow in the metal mold 60, and a hollow or a warp could be caused in the side wall 24.

When the diameter of the glass fiber 52 is smaller than 1 μm, sufficient contribution to the coefficient of thermal expansion of the side wall 24 cannot be obtained. When the diameter of the glass fiber 52 is greater than 50 μm, the molten resin containing the glass fibers 52 is less likely to smoothly flow in the metal mold 60, and a hollow or a warp could be caused in the side wall 24.

When the length of the glass fiber 52 is set to be not less than 0.1 mm and not greater than 3 mm, and the diameter of the glass fiber 52 is set to be not less than 1 μm and not greater than 50 μm, an appropriate side wall 24 can be obtained.

The length of the glass fiber 52 is more preferably not less than 0.2 mm and not greater than 0.5 mm. The diameter of the glass fiber 52 is more preferably not less than 5 μm and not greater than 15 μm.

Modification of Third Embodiment

Figure 18:
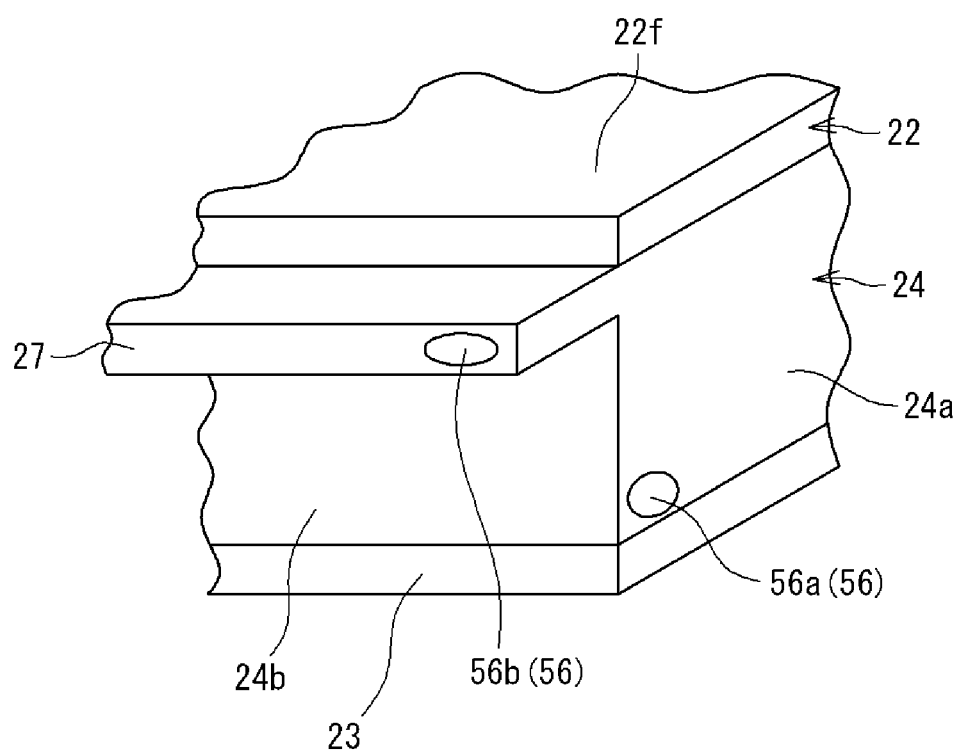
FIG. 18 is an enlarged perspective view showing the appearance of a photovoltaic module according to a modification of the third embodiment.

FIG. 18 is an enlarged perspective view showing the appearance of a photovoltaic module according to a modification of the third embodiment.

The present modification is different from the third embodiment in that, in the present modification, the long-side gate mark 56b is provided to a leading end face 27a of the flange 27.

When the long-side gate mark 56b is provided to the leading end face 27a of the flange 27 in this manner, the long-side gate mark 56b can be made less conspicuous.

The above description includes the features in the additional notes below.

[Additional Note 1]

A photovoltaic module comprising:
a power generating element; and
a housing in which the power generating element is housed, wherein
the housing includes:
  a concentrating portion provided with a lens;
  a bottom portion in which the power generating element is disposed; and
  a side wall which connects the concentrating portion and the bottom portion,
the side wall is formed from a resin,
the lens is a Fresnel lens, and the power generating element is provided at a position that corresponds to the Fresnel lens, and
a distance between the Fresnel lens and the power generating element changes due to expansion or contraction of the side wall.

[Additional Note 2]

A photovoltaic module comprising:
a power generating element; and
a housing in which the power generating element is housed,
the photovoltaic module further comprising
an optical-axis confirmation portion formed integrally with a side wall of the housing, the optical-axis confirmation portion for confirming an optical axis of incident light incident on the photovoltaic module, wherein
the optical-axis confirmation portion guides the incident light to an interior space of the optical-axis confirmation portion, and
an advancing direction of the incident light having been guided to the interior space is confirmable from outside the optical-axis confirmation portion.

<Supplementary Note>

It should be noted that the disclosed embodiments (examples) are to be considered in all aspects as illustrative and not restrictive. The scope of the present invention is defined by the claims, and is intended to include meaning equivalent to the scope of the claims and all modifications within the scope.

REFERENCE SIGNS LIST 1 photovoltaic module
2 pedestal
12 panel housing
21 housing
22 concentrating portion
22f Fresnel lens (lens)
23 bottom portion
24 side wall
24a short-side wall portion
24a1 outer face
24b long-side wall portion
24b1 outer face
27 flange
28 mounting hole
30 power generating element
31 FPC
32 ball lens
33 resin member
40 optical-axis confirmation portion
41 upper face
42 bottom face
43 side face
44 intake hole
45 visual confirmation hole
46 intermediate face
47 passage hole
48 visual confirmation window
50 resin
52 glass fiber
56 gate mark
56a short-side gate mark
56b long-side gate mark
60 metal mold
62 outside block
64 inside block
66 cavity
68 runner
70 gate
72 hot runner portion
72a connection portion
72b resin introduction portion
72c tapered portion
100 photovoltaic apparatus
C1 sun azimuth meter
E1 housing portion
F1 frame member
M1 drive portion

The invention claimed is:

1. A photovoltaic module comprising:
a power generating element configured to receive sunlight to generate power; and
a housing which is closed, the housing having: a concentrating portion provided with a lens configured to concentrate sunlight; a bottom portion in which the power generating element is disposed; and a side wall serving as an outer frame for the bottom portion and supporting the concentrating portion, wherein
the side wall is a resin molded body including a resin and glass fibers dispersed in the resin,
the resin is one of PET (Polyethylene terephthalate), PBT (Polybutylene Terephthalate), and PP (Polypropylene),
the glass fibers are orientated, in the resin, along a crossing direction that crosses a direction of an optical axis of the lens,
the side wall has a rectangular frame shape including four wall portions,
the four wall portions each have a rectangular shape with its longitudinal direction crossing the direction of the optical axis and include a pair of gate marks being a trace of a gate used at injection molding, and the pair of gate marks is provided at each of both end portions in the longitudinal direction of an outer face of each of the four wall portions.

2. The photovoltaic module according to claim 1, wherein a content proportion of the glass fibers in the resin molded body is not less than 5 weight % and not higher than 40 weight %.

3. The photovoltaic module according to claim 1, wherein a length of each glass fiber is not less than 0.1 mm and not greater than 3 mm, and a diameter of the glass fiber is not less than 1 μm and not greater than 50 μm.

* * * * *